(12) United States Patent
Yamazaki

(10) Patent No.: US 8,530,289 B2
(45) Date of Patent: Sep. 10, 2013

(54) METHOD FOR MANUFACTURING SEMICONDUCTOR DEVICE

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 42 days.

(21) Appl. No.: 13/091,194

(22) Filed: Apr. 21, 2011

(65) Prior Publication Data

US 2011/0263084 A1 Oct. 27, 2011

(30) Foreign Application Priority Data

Apr. 23, 2010 (JP) ................... 2010-100241

(51) Int. Cl.
*H01L 21/00* (2006.01)

(52) U.S. Cl.
USPC ............. 438/161; 438/783; 257/E21.37

(58) Field of Classification Search
USPC ............ 438/135, 161, 315; 257/E21.37, 257/E21.372, E21.378, E21.386, E21.4, E21.424
See application file for complete search history.

(56) References Cited

U.S. PATENT DOCUMENTS

| | | | |
|---|---|---|---|
| 5,311,040 A | 5/1994 | Hiramatsu et al. |
| 5,731,856 A | 3/1998 | Kim et al. |
| 5,744,864 A | 4/1998 | Cillessen et al. |
| 6,027,977 A | 2/2000 | Mogami |
| 6,294,274 B1 | 9/2001 | Kawazoe et al. |
| 6,417,565 B1 | 7/2002 | Komatsu |
| 6,563,174 B2 | 5/2003 | Kawasaki et al. |
| 6,727,522 B1 | 4/2004 | Kawasaki et al. |
| 6,767,694 B2 | 7/2004 | Kido |
| 6,917,096 B2 | 7/2005 | Sugiyama et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |

(Continued)

FOREIGN PATENT DOCUMENTS

| CN | 101467257 A | 6/2009 |
|---|---|---|
| EP | 1 737 044 A1 | 12/2006 |

(Continued)

OTHER PUBLICATIONS

Masaki Nakamura et al.; "Syntheses and crystal structures of new homologous compounds, indium iron zinc oxides (InFeO3(ZnO)m) (m: natural number) and related compounds"; 1993; pp. 317-327; vol. 28, No. 5; Kotai Butsuri (Solid State Physics), with translation.

(Continued)

*Primary Examiner* — Cheung Lee
(74) *Attorney, Agent, or Firm* — Fish & Richardson P.C.

(57) ABSTRACT

An embodiment of the disclosed invention is a method for manufacturing a semiconductor device, which includes the steps of forming a first insulating film; performing oxygen doping treatment on the first insulating film to supply oxygen to the first insulating film; forming a source electrode, a drain electrode, and an oxide semiconductor film electrically connected to the source electrode and the drain electrode, over the first insulating film; performing heat treatment on the oxide semiconductor film to remove a hydrogen atom in the oxide semiconductor film; forming a second insulating film over the oxide semiconductor film; and forming a gate electrode in a region overlapping with the oxide semiconductor film, over the second insulating film. The manufacturing method allows the formation of a semiconductor device including an oxide semiconductor, which has stable electrical characteristics and high reliability.

27 Claims, 17 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,531,784 B2 | 5/2009 | Arao et al. |
| 7,544,528 B2 | 6/2009 | Lee et al. |
| 7,601,984 B2 | 10/2009 | Sano et al. |
| 7,674,650 B2 | 3/2010 | Akimoto et al. |
| 7,696,513 B2 | 4/2010 | Hayashi et al. |
| 7,732,819 B2 | 6/2010 | Akimoto et al. |
| 7,767,505 B2 | 8/2010 | Son et al. |
| 7,791,072 B2 | 9/2010 | Kumomi et al. |
| 7,906,780 B2 | 3/2011 | Iwasaki |
| 7,981,734 B2 | 7/2011 | Furuta et al. |
| 7,994,500 B2 | 8/2011 | Kim et al. |
| 7,994,579 B2 | 8/2011 | Itai |
| 8,049,225 B2 | 11/2011 | Yamazaki et al. |
| 8,058,645 B2 | 11/2011 | Jeong et al. |
| 8,125,085 B2 | 2/2012 | Maekawa et al. |
| 8,129,719 B2 | 3/2012 | Yamazaki et al. |
| 8,148,779 B2 | 4/2012 | Jeong et al. |
| 8,178,884 B2 | 5/2012 | Ha et al. |
| 8,178,926 B2 | 5/2012 | Nakayama |
| 8,188,480 B2 | 5/2012 | Itai |
| 8,203,143 B2 | 6/2012 | Imai |
| 8,232,598 B2 | 7/2012 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0265745 A1 | 12/2004 | Sho et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0072233 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0044699 A1 | 2/2010 | Chung et al. |
| 2010/0051937 A1 | 3/2010 | Kaji et al. |
| 2010/0065844 A1 | 3/2010 | Tokunaga |
| 2010/0081091 A1 | 4/2010 | Hashimoto et al. |
| 2010/0092800 A1 | 4/2010 | Itagaki et al. |
| 2010/0109002 A1 | 5/2010 | Itagaki et al. |
| 2010/0163863 A1 | 7/2010 | Yaegashi |
| 2010/0241261 A1 | 9/2010 | Taguchi et al. |
| 2011/0089416 A1 | 4/2011 | Yamazaki et al. |
| 2011/0193083 A1 | 8/2011 | Kim et al. |
| 2011/0215331 A1 | 9/2011 | Yamazaki et al. |
| 2011/0233540 A1 | 9/2011 | Yamazaki |
| 2011/0233541 A1 | 9/2011 | Yamazaki |
| 2011/0233542 A1 | 9/2011 | Yamazaki et al. |
| 2011/0237025 A1 | 9/2011 | Yamazaki |
| 2011/0240990 A1 | 10/2011 | Yamazaki |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0250724 A1 | 10/2011 | Suzawa et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263085 A1 | 10/2011 | Yamazaki |
| 2011/0263091 A1 | 10/2011 | Yamazaki |
| 2011/0269266 A1 | 11/2011 | Yamazaki |
| 2011/0281394 A1 | 11/2011 | Yamazaki |
| 2011/0318875 A1 | 12/2011 | Yamazaki et al. |
| 2012/0119205 A1 | 5/2012 | Taniguchi et al. |
| 2012/0122277 A1 | 5/2012 | Yamazaki et al. |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-237456 A | 10/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-335325 A | 12/1998 |
| JP | 11-505377 A | 5/1999 |
| JP | 2000-044236 A | 2/2000 |

| | | | |
|---|---|---|---|
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-165528 A | 6/2006 | |
| JP | 2007-073558 A | 3/2007 | |
| JP | 2007-073561 A | 3/2007 | |
| JP | 2007-073563 A | 3/2007 | |
| JP | 2007-250984 A | 9/2007 | |
| JP | 2008-060419 A | 3/2008 | |
| JP | 2009-059805 A | 3/2009 | |
| JP | 2009-224737 A | 10/2009 | |
| JP | 2009231613 A | 10/2009 | |
| JP | 2010-021170 A | 1/2010 | |
| JP | 2010-062229 A | 3/2010 | |
| JP | 2010-062276 A | 3/2010 | |
| JP | 2010062548 A | 3/2010 | |
| JP | 2010067954 A | 3/2010 | |
| KR | 2008-0098423 A | 11/2008 | |
| WO | 2004/114391 A1 | 12/2004 | |
| WO | 2007/119321 A2 | 10/2007 | |

OTHER PUBLICATIONS

Tetsufumi Kawamura et al.; "Low-Voltage Operating Amorphous Oxide TFTs"; IDW '09 : Proceedings of the 16TH International Display Workshops; Dec. 9, 2009; pp. 1689-1692.

International Search Report, PCT Application No. PCT/JP2011/058659, dated Jul. 12, 2011, 4 pages.

Written Opinion, PCT Application No. PCT/JP2011/058659, dated Jul. 12, 2011, 5 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Yet al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-cholesteric Liquid Crystal Transition: The "Blue Phase, " Physics Letters, Sept. 10,1973, vol. 45A, No. 2, pp. 115-116.

Costello, M et al., "Electron Microscopy of a Cholesteric Liquid Crystal and It's Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069

Fortunato, E et al., "Wide-Bandgap High-Mobility ZNO Thin-Film Transistors Produce at Room Temperature, " Appl. Phs. Lett. (Applied Physics Letters), Sept. 27,2004, vol.85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., P-9: Numerical Analysis on Temperature Dependence of Characteristics of Amorphous IN-GA-ZN-OXIDE TFT, SID Digest '09 : SID International Symposium Digest of Technical Papers, May 31, 2009, pp. 1110-1112.

Godo, H et al., "Temperature Dependence of Characteristics and Electronic Structure for Amorphous IN-GA-ZN-OXIDE TFT," AM-FPD '09 Digest of Technical Papers, Jul. 1, 2009, pp. 41-44.

Hayashi, Ret al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, a et al., "Native Point Defects in ZnO," Phys. Rev. B (Physical Review. B), 2007, vol. 76, No. 16, pp. 165202-1-165202-22.

Janotti, a et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA Amoled Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5 ) Flexible Full Color Top Emission Amoled Display on Plastic Film and Its Bending Properties", SID Digest '09 : SID International Symposium Digest of Technical Papers, May 31, 2009, pp. 983-985.

Kanno, H et al., "White Stacked Electrophosphorecent Organic Light-Emitting Devices Employing M003 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," the Electrochemical Society, 214TH Ecs Meeting, 2008, No. 2317, 1 page.

Kimizuka, n. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N. et al., "Syntheses and Single-Crystal Data of Homologous Compounds, 1n2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13TH International Display Workshops, Dec. 7, 2006, pp. 663-666.

Lee, J et al., "World'S Largest (15-Inch) XGA Amlcd Panel Using Igzo Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. ' "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl, Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla flexible Micolctroni on their way to business," SID Digest '07 : SID Interbational Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of th 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English Translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-film transistr Fabricated in singl-crystalline transparent oxide semiconductor," Science, May 3, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) ,2006, vol. 45, No. 5B, pp. 4303-4308.

Nomura, K et al., "Room-Temperature Fabrication of Transparent Flexible Thin-Film Transistors Using Amorphous Oxide Semiconductors," Natur, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem Oleds," SID Digest '09 : SID International Symposium Digest of Technical Papers, May 31, 2009, vol. 40, pp. 899-902.

Oba, F et al., "Defect energetics in ZnO: a hybrid Hartree-Fock density functional study," Phys. Rev. B (Physical Review. B), 2008, vol. 77, pp. 245202-1-245202-6.

Oh, M et al., "Improving the Gate Stability of Zno Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA Amoled Display Using In-Ga-Zn-Oxide Tfts With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA Amoled Display," AM-FPD '09 Digest of Technical Papers, Jul. 1, 2009, pp. 227-230, the Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size Amoled." AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652

Sakata, J et al., "Development of 4.0-In. Amoled Display With Driver Circuit Using Amorphous In-Ga-Zn-Oxide Tfts," IIDW '09 : Proceedings of the 16TH International Display Workshops, 2009, pp. 689-692.

Son, K et al., "42.4L: Late-News Paper: 4 Inch QVGA Amoled Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15TH International Display Workshops, Dec. 3, 2008, pp. 1637-1640.

Tsuda, K et al., "Ultra Low Power Consumption Technologies for Mobile TFT-LCDs," IDW '02 : Proceedings of the 9TH International Display Workshops, Dec. 4, 2002, pp. 295-298.

Ueno, K et al., "Field-Effect Transistor on SrTiO3 with Sputtered Al2O3 Gate Insulator," App. Phys. lett. (Applid Phsics Letters), Sep. 1, 2003, vol. 83, No. 9, pp. 1755-1757.

Van de Walle, C, "Hdrogen as a Cause of Droping in Zinc Oxide," Phys. Rev. Lett. (Physical Review Letters), Jul. 31, 2000, vol. 85, No. 5, pp. 1012-1015.

Nakayama et al., "17a-TL-8 Effect of GaO Layer on IGZO-TFT Channel," Extended Abstracts (the 57th Spring Meeting 2010), The Japan Society of Applied Physics and Related Societies, Mar. 17, 2010, pp. 21-008, with Full English Translation.

METHOD FOR MANUFACTURING SEMICONDUCTOR DEVICE

TECHNICAL FIELD

The present invention relates to a semiconductor device and a method for manufacturing the semiconductor device.

In this specification, a semiconductor device means a device which can function by utilizing semiconductor characteristics, and an electrooptic device, a semiconductor circuit, and an electronic appliance are all semiconductor devices.

BACKGROUND ART

A technique for forming transistors using semiconductor thin films formed over a substrate having an insulating surface has been attracting attention. The transistors are applied to a wide range of electronic devices such as integrated circuits (ICs) or image display devices (display devices). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

Patent Document

[Patent Document 1] Japanese Published Patent Application No. 2006-165528

DISCLOSURE OF INVENTION

However, when hydrogen or water, which forms an electron donor, is included into the oxide semiconductor in a process for manufacturing a device, the electrical conductivity of an oxide semiconductor may change. Such a phenomenon causes variation in the electrical characteristics of a transistor using the oxide semiconductor.

In view of such a problem, an object of an embodiment of the present invention is to provide a semiconductor device including an oxide semiconductor, which has stable electrical characteristics and high reliability. In a process for manufacturing a transistor including an oxide semiconductor film, at least oxygen doping treatment is performed.

In the process for manufacturing a transistor including an oxide semiconductor film, dehydration or dehydrogenation treatment is performed by heat treatment and oxygen doping treatment is performed.

An embodiment of the disclosed invention is a method for manufacturing a semiconductor device, which includes the steps of: forming a first insulating film over a substrate; performing oxygen doping treatment on the first insulating film to supply an oxygen atom to the first insulating film; forming a source electrode, a drain electrode, and an oxide semiconductor film electrically connected to the source electrode and the drain electrode, over the first insulating film; performing heat treatment on the oxide semiconductor film to remove a hydrogen atom in the oxide semiconductor film; forming a second insulating film over the oxide semiconductor film; and forming a gate electrode in a region overlapping with the oxide semiconductor film, over the second insulating film.

An embodiment of the disclosed invention is a method for manufacturing a semiconductor device, which includes the steps of: forming a first insulating film containing an oxygen atom as a component, over a substrate; performing oxygen doping treatment on the first insulating film to supply an oxygen atom to the first insulating film; forming a source electrode, a drain electrode, and an oxide semiconductor film electrically connected to the source electrode and the drain electrode, over the first insulating film; performing heat treatment on the oxide semiconductor film to remove a hydrogen atom in the oxide semiconductor film; performing oxygen doping treatment on the oxide semiconductor film to supply an oxygen atom to the oxide semiconductor film; forming a second insulating film containing an oxygen atom as a component over the oxide semiconductor film; and forming a gate electrode in a region overlapping with the oxide semiconductor film, over the second insulating film.

An embodiment of the disclosed invention is a method for manufacturing a semiconductor device; which includes the steps of: forming a first insulating film containing an oxygen atom as a component over a substrate; performing oxygen doping treatment on the first insulating film to supply an oxygen atom to the first insulating film; forming a source electrode, a drain electrode, and an oxide semiconductor film electrically connected to the source electrode and the drain electrode, over the first insulating film; performing heat treatment on the oxide semiconductor film to remove a hydrogen atom in the oxide semiconductor film; forming a second insulating film containing an oxygen atom as a component over the oxide semiconductor film; performing oxygen doping treatment on the second insulating film to supply an oxygen atom to the second insulating film; and forming a gate electrode in a region overlapping with the oxide semiconductor film, over the second insulating film.

In the above method, oxygen doping treatment may also be performed on the oxide semiconductor film so that the oxide semiconductor film contains an oxygen atom at a proportion greater than a stoichiometric proportion of the oxide semiconductor film and less than double of the stoichiometric proportion.

In the above method, as the first insulating film or the second insulating film, an insulating film containing a constituent element of the oxide semiconductor film may be formed. As the first insulating film or the second insulating film, an insulating film containing a constituent element of the oxide semiconductor film and a film containing a different element from the constituent element of the insulating film may be formed. As the first insulating film or the second insulating film, an insulating film containing gallium oxide may be formed. As the first insulating film or the second insulating film, an insulating film containing gallium oxide and a film containing a different material from gallium oxide may be formed. Note that in this specification, the term "gallium oxide" means that oxygen and gallium are included as components and is not limited to a state as gallium oxide unless otherwise specified. For example, the "insulating film containing gallium oxide" can be regarded as an "insulating film containing oxygen and gallium."

In the above method, an insulating film containing nitrogen may be formed to cover the gate electrode. In the case where an insulating film including silicon nitride or the like which does not contain hydrogen or contains an extremely small amount of hydrogen is formed over the oxide semiconductor film, the oxygen added to at least one of the first insulating film, the second insulating film, and the oxide semiconductor film can be prevented from being released to the outside and hydrogen and water can be prevented from entering from the outside. For this reason, the insulating film containing nitrogen is important.

Note that the above-described "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

By the oxygen doping treatment, oxygen exists in at least one of the oxide semiconductor film (a bulk thereof), the insulating film (a bulk thereof), and an interface between the oxide semiconductor film and the insulating film at an amount which is greater than a stoichiometric proportion. The amount of oxygen is preferably greater than the stoichiometric proportion and less than four times of the stoichiometric proportion, more preferably greater than the stoichiometric proportion and less than double of the stoichiometric proportion. Here, an oxide including excessive oxygen whose amount is greater than the stoichiometric proportion refers to, for example, an oxide which satisfies $2g>3a+3b+2c+4d+3e+2f$, where the oxide is represented as $In_aGa_bZn_cSi_dAl_eMg_fO_g$ (a, b, c, d, e, f, g≧0). Note that oxygen which is added by the oxygen doping treatment may exist between lattices of the oxide semiconductor.

In addition, oxygen is added so that the amount of the added oxygen is larger than at least the amount of hydrogen in the dehydrated or dehydrogenated oxide semiconductor. When the amount of the added oxygen is larger than that of hydrogen, the oxygen is diffused and reacts with hydrogen which causes instability, so that hydrogen can be fixed (made to be an immovable ion). In other words, reduction in reliability can be prevented. In addition, with excessive oxygen, variation in a threshold voltage Vth caused by oxygen deficiency can be reduced and the amount of shift ΔVth of the threshold voltage can be reduced.

Note that oxygen whose amount is equal to the above-described amount preferably exists in two or more of the oxide semiconductor film (the bulk), the insulating film (the bulk), and the interface between the oxide semiconductor film and the insulating film.

Note that in the case where an oxide semiconductor has no oxygen defect (oxygen deficiency), the amount of oxygen included in the oxide semiconductor may be equal to the stoichiometric proportion of the oxide semiconductor film. However, in order to secure reliability, for example, to suppress variation in the threshold voltage of a transistor, an oxide semiconductor preferably includes oxygen whose amount is greater than the stoichiometric proportion. Similarly, in the case where an oxide semiconductor has no defect (oxygen deficiency), the base film is not necessarily an insulating film containing excessive oxygen. However, in order to secure reliability, for example, to suppress variation in the threshold voltage of a transistor, the base film is preferably the insulating film containing excessive oxygen, considering that oxygen deficiency may occur in the oxide semiconductor film.

Here, a state in which oxygen is added to the bulk by the above-described "oxygen plasma doping" treatment is described. Note that when oxygen doping treatment is performed on an oxide semiconductor film containing oxygen as one component, it is generally difficult to check an increase or a decrease of the oxygen concentration. Therefore, here, an effect of oxygen doping treatment was confirmed with the use of a silicon wafer.

Oxygen doping treatment was performed with the use of an inductively coupled plasma (ICP) method. Conditions thereof are as follows: the ICP power was 800 W; the RF bias power was 300 W or 0 W; the pressure was 1.5 Pa; the gas flow of oxygen rate was 75 sccm; and the substrate temperature was 70° C. FIG. 15 shows an oxygen concentration profile in the depth direction of the silicon wafer measured by secondary ion mass spectrometry (SIMS). In FIG. 15, the vertical axis represents an oxygen concentration; the horizontal axis represents a depth from a surface of the silicon wafer.

It can be confirmed from FIG. 15 that oxygen is added in either of cases where the RF bias power is 0 W or the RF bias power is 300 W. In addition, in the case where the RF bias power is 300 W, oxygen is added more deeply as compared to the case of the RF bias power of 0 W.

Next, FIGS. 16A and 16B show results of observation of a cross section of the silicon wafer before and after the oxygen doping treatment by scanning transmission electron microscopy (STEM). FIG. 16A is a STEM image of the silicon wafer which was not subjected to the oxygen doping treatment. FIG. 16B is a STEM image of the silicon wafer which was subjected to the oxygen doping treatment at the RF bias voltage of 300 W. As shown in FIG. 16B, it can be found that an oxygen-highly-doped region is formed in the silicon wafer by the oxygen doping.

As described above, it is shown that oxygen is added to the silicon wafer by performing oxygen doping on the silicon wafer. From this result, it is natural that oxygen can be added to an oxide semiconductor film by performing oxygen doping on the oxide semiconductor film.

The effect of the above structure which is an embodiment of the disclosed invention can be easily understood as follows. Note that the below description is just one consideration.

When a positive voltage is applied to the gate electrode, an electric field is generated from a gate electrode side of the oxide semiconductor film to a back channel side (the opposite side to the gate insulating film). Therefore, hydrogen ions having positive charge which exist in the oxide semiconductor film are transported to the back channel side, and accumulated in a region close to an interface with the insulating film. The positive charge is transported from the accumulated hydrogen ion to a charge trapping center (such as a hydrogen atom, water, or contamination) in the insulating film, whereby negative charge is accumulated in the back channel side of the oxide semiconductor film. In other words, a parasitic channel is generated in the back channel side of the transistor, and the threshold voltage is shifted to the negative side, so that the transistor tends to be normally-on.

In this manner, the charge trapping center such as hydrogen or water in the insulating film traps the positive charge and the positive charge is transported into the insulating film, whereby electrical characteristics of the transistor vary. Accordingly, in order to suppress variation of the electrical characteristics of the transistor, it is important that there is no charge trapping center or the amount of hydrogen, water, or the like is small in the insulating film. Therefore, when an insulating film is deposited, a sputtering method which causes less hydrogen contained in the deposited insulating film is preferably used. In an insulating film deposited by a sputtering method, there is no charge trapping center or a small number of charge trapping centers, and the transport of positive charge does not easily occur as compared to that in the case of using a CVD method or the like. Therefore, the shift of the threshold voltage of the transistor can be suppressed, and the transistor can be normally off.

Note that in a top-gate transistor, when an oxide semiconductor film is formed over an insulating film serving as a base film and then heat treatment is performed thereon, not only water or hydrogen contained in the oxide semiconductor film but also water or hydrogen contained in the insulating film can be removed. Accordingly, in the insulating film, there is a small number of charge trapping centers for trapping positive charge transported through the oxide semiconductor film. In this manner, the heat treatment for dehydration or dehydrogenation is also performed on the insulating film located below the oxide semiconductor film, in addition to the oxide semiconductor film. Therefore, in the top-gate transistor, the insulating film serving as a base film may be deposited by a CVD method such as a plasma CVD method.

In addition, when a negative voltage is applied to the gate electrode, an electric field is generated from the back channel side to the gate electrode side. Thus, hydrogen ions which exist in the oxide semiconductor film are transported to the gate insulating film side and accumulated in a region close to the interface with the gate insulating film. As a result, the threshold voltage of the transistor is shifted to the negative side.

Note that when a voltage is kept at 0 V, the positive charge is released from the charge trapping center, so that the threshold voltage of the transistor is shifted to the positive side, thereby returning to the initial state, or the threshold voltage is shifted to the positive side beyond the initial side in some cases. These phenomena indicate the existence of easy-to-transport ions in the oxide semiconductor film. It can be considered that an ion which is transported most easily is an ion of hydrogen that is the smallest atom.

In addition, when the oxide semiconductor film absorbs light, a bond (also referred to as an M-H bond) of a metal element (M) and a hydrogen atom (H) in the oxide semiconductor film is broken by photoenergy. Note that the photoenergy having a wavelength of approximately 400 nm equals or substantially equals to the bond energy of a metal element and a hydrogen atom. When a negative gate bias is applied to a transistor in which a bond of a metal element and a hydrogen atom in the oxide semiconductor film is broken, a hydrogen ion eliminated from a metal element is attracted to a gate electrode side, so that distribution of charge is changed, the threshold voltage of the transistor is shifted to the negative side, and the transistor tends to be normally on.

Note that the hydrogen ions which are transported to the interface with the gate insulating film by light irradiation and application of a negative gate bias to the transistor are returned to the initial state by stopping application of voltage. This can be regarded as a typical example of the ion transport in the oxide semiconductor film.

In order to prevent such a change of the electrical characteristics by voltage application (BT degradation) or a change of the electrical characteristics by light irradiation (light degradation), it is most important to remove a hydrogen atom or an impurity containing a hydrogen atom such as water thoroughly from the oxide semiconductor film to highly purify the oxide semiconductor film. The charge density as small as $1\times10^{15}$ cm$^{-3}$, or the charge per unit area which is as small as $1\times10^{10}$ cm$^{-2}$ does not affect the transistor characteristics or very slightly affects them. Therefore, it is preferable that the charge density be less than or equal to $1\times10^{15}$ cm$^{-3}$. Assuming that 10% of hydrogen contained within the oxide semiconductor film is transported within the oxide semiconductor film, it is preferable that the hydrogen concentration is less than or equal to $1\times10^{16}$ cm$^{-3}$. Further, in order to prevent entrance of hydrogen from the outside after a device is completed, it is preferable that a silicon nitride film formed by a sputtering method be used as a passivation film to cover the transistor.

Hydrogen or water can also be removed from the oxide semiconductor film when an excessive amount of oxygen is added as compared to hydrogen to the oxide semiconductor film (such that (the number of hydrogen atoms)<<(the number of oxygen radicals) or (the number of oxygen ions)). Specifically, oxygen is made to be plasma by a radio-frequency wave (RF), the bias of the substrate is increased, and an oxygen radical and/or an oxygen ion are/is doped or added into the oxide semiconductor film over the substrate such that the amount of oxygen is greater than that of hydrogen in the oxide semiconductor film. The electronegativity of oxygen is 3.0 which is larger than about 2.0, the electronegativity of a metal (Zn, Ga, In) in the oxide semiconductor film, and thus, excessive oxygen contained as compared to hydrogen abstracts hydrogen from the M-H group so that an OH group is formed. This OH group may form an M-O—H group with a bond to M.

The doping is preferably performed so that the amount of oxygen contained in the oxide semiconductor film be greater than the stoichiometric proportion. For example, in the case where an In—Ga—Zn—O-based oxide semiconductor film is used as the oxide semiconductor film, it is far preferable that the proportion of oxygen be made to greater than the stoichiometric proportion and less than double of the stoichiometric proportion by oxygen doping or the like. For example, when the stoichiometric proportion of a single crystal of an In—Ga—Zn—O-based oxide semiconductor is such that In:Ga:Zn:O=1:1:1:4, in an oxide semiconductor thin film whose composition is represented by InGaZnO$_x$, x is preferably greater than 4 and less than 8. Accordingly, the amount of oxygen is greater than that of hydrogen in the oxide semiconductor film.

Photoenergy or BT stress abstracts hydrogen from the M-H group, which causes degradation; however, in the case where oxygen is added by the above-described doping, added oxygen is bonded with a hydrogen ion, so that an OH group is formed. The OH group does not discharge a hydrogen ion even by light irradiation or application of BT stress on the transistor because of its high bond energy, and is not easily transported in the oxide semiconductor film because of its greater mass than the mass of a hydrogen ion. Accordingly, an OH group formed by oxygen doping does not cause degradation of the transistor or can suppress the degradation.

In addition, it has been confirmed that as the thickness of the oxide semiconductor film is increased, the variation in the threshold voltage of a transistor tends to increase. It is considered that oxygen deficiency in the oxide semiconductor film is one cause of the change of the threshold voltage and increases as the thickness of the oxide semiconductor film is increased. It is effective not only for removal of hydrogen or water from the oxide semiconductor film but also for compensation of oxygen deficiency in the film to dope an insulating film or an oxide semiconductor film with oxygen in a transistor according to an embodiment of the disclosed invention. Accordingly, the variation in the threshold voltage can also be suppressed in the transistor according to an embodiment of the disclosed invention.

Metal oxide films each containing a component which is the same as a component of the oxide semiconductor film may be provided with the oxide semiconductor film provided therebetween, which is also effective for prevention of change of the electrical characteristics. As the metal oxide film containing a component which is the same as a component of the oxide semiconductor film, specifically, a film containing at least one selected from the constituent elements of the oxide semiconductor film is preferably used. Such a material is suitable for the oxide semiconductor film, and therefore, provision of the metal oxide films with the oxide semiconductor film provided therebetween enables an interface between the metal oxide film and the oxide semiconductor film to be kept in an appropriate state. That is, by providing the metal oxide film using the above-described material as an insulating film which is in contact with the oxide semiconductor film, accumulation of hydrogen ions in the interface of the between the metal oxide film and the oxide semiconductor film and in the vicinity thereof can be suppressed or prevented. Accordingly, as compared to the case where insulating films each containing a different component from that of the oxide semiconductor film, such as silicon oxide films, are provided with the oxide semiconductor film provided therebetween, the hydrogen concentration in the interface with the oxide semiconductor film, which affects the threshold voltage of the transistor, can be sufficiently decreased.

A gallium oxide film is preferably used as the metal oxide film. Since gallium oxide has a wide bandgap (Eg), by providing gallium oxide films with the oxide semiconductor film provided therebetween, an energy barrier is formed in the interface between the oxide semiconductor film and the metal oxide film to prevent carrier transport in the interface. Consequently, carriers are not transported from the oxide semiconductor film to the metal oxide film, but are transported within the oxide semiconductor film. On the other hand, a hydrogen ion passes through the interface between the oxide semiconductor film and the metal oxide film and is accumulated in the vicinity of an interface between the metal oxide film and the insulating film. Even when the hydrogen ion is accumulated in the vicinity of the interface with the insulating film, a parasitic channel through which carriers can flow is not formed in the metal oxide film such as a gallium oxide film, which results in no affect or a very slight affect on the threshold voltage of the transistor. The energy barrier in the case where gallium oxide is in contact with a In—Ga—Zn—O-based material is about 0.8 eV on the conduction band side and is about 0.9 eV on the valence band side.

As described above, one technological idea of a transistor according to an embodiment of the disclosed invention is to increase the amount of oxygen contained in at least one of an insulating film in contact with an oxide semiconductor film, the oxide semiconductor film, and the vicinity of an interface between them by oxygen doping treatment.

In the case where an oxide semiconductor material which contains In whose bonding strength with oxygen is relatively weak is used for the oxide semiconductor film, when the insulating film in contact with the oxide semiconductor film contains a material which has a stronger bonding strength with oxygen, such as silicon, oxygen in the oxide semiconductor film may be abstracted by heat treatment, which may cause formation of oxygen deficiency in the vicinity of the interface of the oxide semiconductor film. However, in a transistor according to an embodiment of the disclosed invention, the formation of oxygen deficiency due to abstraction of oxygen from the oxide semiconductor film can be suppressed by supplying excessive oxygen to the insulating film in contact with the oxide semiconductor film.

Here, after the oxygen doping treatment is performed in the manufacturing process of a transistor, the amount of oxygen which is greater than the stoichiometric proportion and is contained in the oxide semiconductor film or the insulating film in contact with the oxide semiconductor film may be different between layers. It can be considered that chemical potential of oxygen is different between the layers where the amount of excessive oxygen is different between them, and the difference in the chemical potential comes to an equilibrium or a substantial equilibrium by heat treatment or the like in the manufacturing process of the transistor. Therefore, after the oxygen doping treatment on the insulating film, heat treatment is preferably performed. By the heat treatment after the oxygen doping treatment, oxygen which is excessively supplied to the insulating film can be diffused and a sufficient amount of oxygen can be supplied to the oxide semiconductor film. Distribution of oxygen in the equilibrium state is discussed below.

The equilibrium state at a temperature T at a pressure P refers to the state in which a Gibbs free energy of the whole of the systems, G is the minimum, which is represented by the following formula (1).

[FORMULA 1]

$$G(N_a, N_b, N_c, \ldots, T, P) = G^{(1)}(N_a, N_b, N_c, \ldots, T, P) + G^{(2)}(N_a, N_b, N_c, \ldots, T, P) + G^{(3)}(N_a, N_b, N_c, \ldots, T, P) \quad (1)$$

In the formula (1), reference symbols $G^{(1)}$, $G^{(2)}$, and $G^{(3)}$ denote Gibbs free energies of layers. Reference symbols $N_a$, $N_b$, and $N_c$ denote the number of particles, and reference symbols a, b, and c denote particle kinds. The Gibbs free energy changes as represented by the following formula (2) when the particle a is transported from an i layer to a j layer by $\delta N_a^{(j)}$.

[FORMULA 2]

$$\delta G = -\frac{\partial G^{(i)}}{\partial N_a^{(i)}} \delta N_a^{(j)} + \frac{\partial G^{(j)}}{\partial N_a^{(j)}} \delta N_a^{(j)} \quad (2)$$

When $\delta G$ is 0 in the formula (2), or the following formula (3) is satisfied, the system is in the equilibrium state.

[FORMULA 3]

$$\frac{\partial G^{(i)}}{\partial N_a^{(i)}} = \frac{\partial G^{(j)}}{\partial N_a^{(j)}} \quad (3)$$

The differential of the number of particles of the Gibbs free energy corresponds to the chemical potential, and thus the chemical potential of particles is uniform in the layers in the equilibrium state.

In other words, when the amount of oxygen contained in the insulating film in contact with the oxide semiconductor film is excessive as compared to the oxide semiconductor film, the chemical potential of oxygen is relatively small in the oxide semiconductor film and is relatively large in the insulating film.

When the temperature of the whole of the systems (e.g., the oxide semiconductor film and the insulating film in contact with the oxide semiconductor film, here) becomes high enough to cause atom diffusion in the layer and between the layers by heat treatment in the manufacturing process of the transistor, oxygen is transported so as to make the chemical potentials uniform. That is, oxygen in the insulating film is transported to the oxide semiconductor film, whereby the chemical potential of the insulating film is decreased and the chemical potential of the oxide semiconductor film is increased.

In this manner, oxygen supplied excessively to the oxide semiconductor film by the oxygen doping treatment is diffused to be supplied to the insulating film (including its interface) by the following heat treatment to make the chemical potential of the systems to be in the equilibrium state. Therefore, in the case where excessive oxygen exists enough in the oxide semiconductor film, the insulating film (including its interface) in contact with the oxide semiconductor film can be made to contain excessive oxygen.

Therefore, it is beneficial to supply oxygen the amount of which is enough to (or greater than that to) compensate an oxygen defect in the insulating film or the interface with the insulating film, to the oxide semiconductor film.

In the transistor including the oxide semiconductor film which contains an excessive amount of oxygen through dehydration or dehydrogenation performed by heat treatment and oxygen doping treatment for the insulating films, the amount of change in the threshold voltage of the transistor from before to after a bias-temperature (BT) test is small, whereby the highly-reliable transistor having stable electrical characteristics can be obtained.

According to an embodiment of the disclosed invention, a variety of semiconductor devices including highly-reliable transistors having stable electrical characteristic can be manufactured.

BEST MODE FOR CARRYING OUT THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments.

In this specification, ordinal numbers such as "first", "second", and "third" are used in order to avoid confusion among components, and the terms do not limit the components numerically.

Embodiment 1

In this embodiment, a semiconductor device and a method for manufacturing the semiconductor device will be described with reference to FIGS. 1A to 1C, FIGS. 2A to 2G and FIGS. 3A to 3D.

<Structural Example of Semiconductor Device>

Figure 1A:
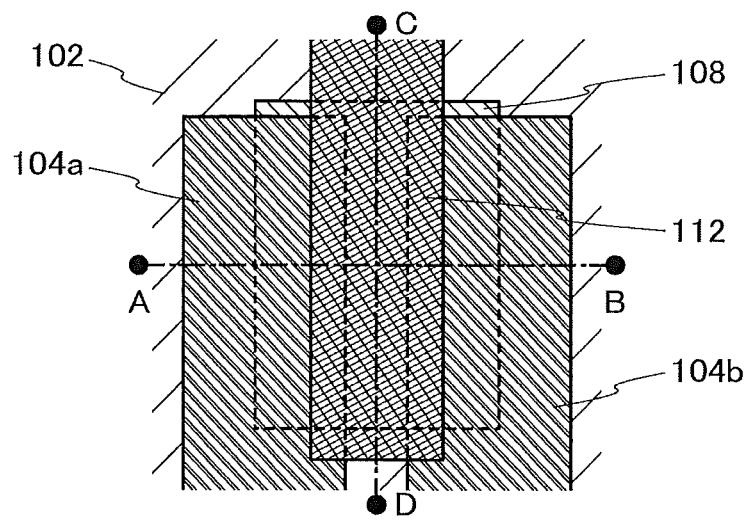
FIGS. 1A to 1C illustrate an embodiment of a semiconductor device.
Figure 1B:
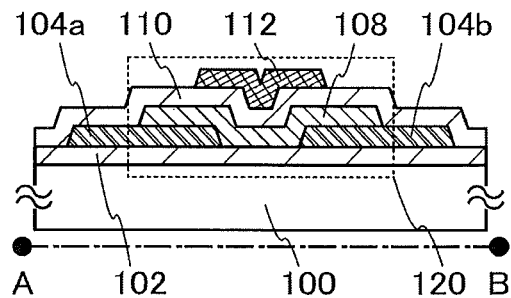
Figure 1C:
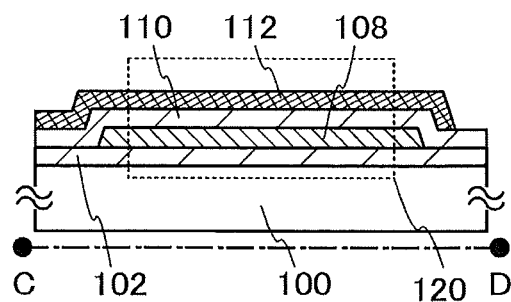

FIGS. 1A to 1C illustrate a structural example of a transistor 120. Here, FIG. 1A is a plan view, FIG. 1B is a cross-sectional view along A-B of FIG. 1A, and FIG. 1C is a cross-sectional view along C-D of FIG. 1A. Note that some of components of the transistor 120 (e.g., a gate insulating film 110) are omitted in FIG. 1A for brevity.

The transistor 120 in FIGS. 1A to 1C includes, over a substrate 100, an insulating film 102, a source electrode 104a, a drain electrode 104b, an oxide semiconductor film 108, the gate insulating film 110, and a gate electrode 112.

In the transistor 120 in FIGS. 1A to 1C, the insulating film 102 is a film which has been subjected to oxygen doping treatment. By performing oxygen doping treatment on the insulating film 102, the transistor 120 with improved reliability can be obtained.

<Example of Manufacturing Process of Semiconductor Device>

An example of a manufacturing process of the semiconductor device in FIGS. 1A to 1C will be described below with reference to FIGS. 2A to 2G.

Figure 2A:
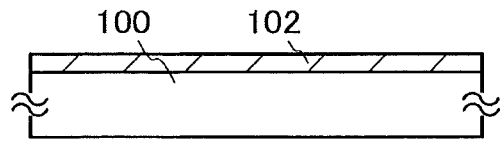
FIGS. 2A to 2G illustrate an embodiment of a method for manufacturing a semiconductor device.

First, the insulating film 102 is formed over the substrate 100 (see FIG. 2A).

There is no particular limitation on a material of the substrate 100 as long as the material has at least heat resistance high enough to withstand heat treatment performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may alternatively be used as the substrate 100. When a transistor is provided over the flexible substrate, the transistor may be directly formed over the flexible substrate, or the transistor may be formed over a different substrate and then separated to be transferred to the flexible substrate. In order to separate the transistor and transfer it to the flexible substrate, a separation layer is preferably formed between the different substrate and the transistor.

The insulating film 102 serves as a base. Specifically, the insulating film 102 may be formed using silicon oxide, silicon nitride, aluminum oxide, aluminum nitride, gallium oxide, a mixed material thereof, or the like. The insulating film 102 may be formed with a single-layer structure or a layered structure using an insulating film including any of the above materials.

There is no particular limitation on the method for forming the insulating film 102. For example, the insulating film 102 can be formed by a deposition method such as a plasma CVD method or a sputtering method. A sputtering method is preferable in terms of low possibility of entry of hydrogen, water, and the like.

Note that it is particularly preferable to form the insulating film 102 with the use of an insulating material containing a component which is the same as a component of an oxide semiconductor film formed later. Such a material is suitable for an oxide semiconductor film; thus, when it is used for the insulating film 102, the state of the interface with the oxide semiconductor film can be kept favorably. Here, containing "a component which is the same as a component of an oxide semiconductor film" means containing one or more of elements selected from constituent elements of the oxide semiconductor film. For example, in the case where the oxide semiconductor film is formed using an In—Ga—Zn—O-based oxide semiconductor material, a gallium oxide or the like is given as such an insulating material containing a component which is the same as a component of the oxide semiconductor film In the case where the insulating film 102 has a layered structure, it is further preferable to employ a layered structure of a film formed using an insulating material containing a component which is the same as a component of the oxide semiconductor film (hereinafter referred to as a film a) and a film containing a material different from a constituent material of the film a (hereinafter referred to as a film b). The reason is as follows. When the insulating film 102 has such a structure in which the film a and the film b are sequentially stacked from the oxide semiconductor film side, charge is trapped preferentially at the interface between the film a and the film b (compared with the interface between the oxide semiconductor film and the film a). Thus, trapping of charge at the interface of the oxide semiconductor film can be sufficiently suppressed, resulting in higher reliability of the semiconductor device.

Note that as such a layered structure, a layered structure of a gallium oxide film and a silicon oxide film, a layered structure of a gallium oxide film and a silicon nitride film, or the like can be used.

Figure 2B:
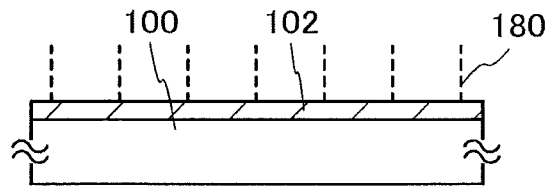

Next, the insulating film 102 is subjected to treatment using oxygen 180 (also referred to as oxygen doping treatment or oxygen plasma doping treatment) (see FIG. 2B). Here, the oxygen 180 contains at least any of an oxygen radical, an oxygen atom, and an oxygen ion. By performing oxygen doping treatment on the insulating film 102, oxygen can be contained in the insulating film 102, and oxygen can be contained in either or both the oxide semiconductor film 108 formed later or/and in the vicinity of the interface of the oxide semiconductor film 108. In that case, the amount of oxygen contained in the insulating film 102 is greater than the stoichiometric proportion of the insulating film 102, or is preferably greater than the stoichiometric proportion and less than four times of the stoichiometric proportion, more preferably greater than the stoichiometric proportion and less than double of the stoichiometric proportion. Alternatively, the amount of oxygen in the insulating film 102 can be greater than Y, or can be preferably greater than Y and less than 4Y, where the amount of oxygen in the case where the material of the insulating film 102 is a single crystal is Y. Still alternatively, the amount of oxygen contained in the insulating film 102 can be greater than Z, and can be preferably greater than Z or less than 4Z based on the amount of oxygen Z in the insulating film in the case where oxygen doping treatment is not performed.

For example, in the case where gallium oxide whose composition is represented by $GaO_x$ ($x>0$) is used, since a single crystal of gallium oxide is $Ga_2O_3$, x can be greater than 1.5 and less than 6 (i.e., the amount of O is greater than 1.5 times of that of Ga and less than 6 times of that of Ga). Alternatively, for example, in the case where silicon oxide whose composition is represented by $SiO_x$ ($x>0$) is used, when $SiO_2$ (i.e., the amount of O is double of that of Si) is employed, x is greater than 2 and less than 8 (i.e., the amount of O is greater than double of that of Si and less than 8 times of that of Si). Note that such an oxygen excessive region may exist in part of the insulating film (including its interface).

In the oxide semiconductor film, oxygen is one of the main constituent materials. Thus, it is difficult to accurately estimate the oxygen concentration of the oxide semiconductor film by a method such as secondary ion mass spectrometry (SIMS). In other words, it can be said that it is hard to determine whether oxygen is intentionally added to the oxide semiconductor film.

Isotopes such as $O^{17}$ or $O^{18}$ exist in oxygen, and it is know that the existence proportions of them in nature are about 0.038% and about 0.2% of all the oxygen atoms. That is to say, it is possible to measure the concentrations of these isotopes in the oxide semiconductor film by a method such as SIMS; therefore, the oxygen concentration of the oxide semiconductor film may be able to be estimated more accurately by measuring the concentrations of these isotopes. Thus, the concentrations of these isotopes may be measured to determine whether oxygen is intentionally added to the oxide semiconductor film.

For example, when the concentration of $O^{18}$ is used as the reference, $D1(O^{18}) > D2(O^{18})$ is satisfied where $D1(O^{18})$ is the concentration of an isotope of oxygen in a region of the oxygen-doped oxide semiconductor film, and $D2(O^{18})$ is the concentration of an isotope of oxygen in a region of the oxide semiconductor film which is not doped with oxygen.

It is preferable that at least part of the oxygen 180 added to the insulating film have dangling bonds in the oxide semiconductor film after being added to the semiconductor. This is because such dangling bonds are bonded with hydrogen remaining in the film so that hydrogen can be fixed (made to be immovable ions).

The oxygen 180 can be generated by a plasma generating apparatus or an ozone generating apparatus. More specifically, for example, an apparatus capable of etching of a semiconductor device, an apparatus capable of ashing of a resist mask, or the like is used to generate the oxygen 180, and the insulating film 102 can be processed.

Note that it is preferable to apply an electrical bias to the substrate in order to perform oxygen doping more favorably.

Figure 2C:
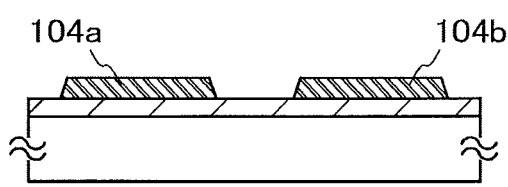
Figure 2D:
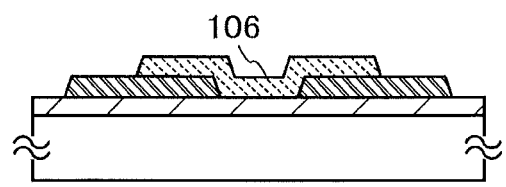

Next, a conductive film for forming the source electrode and the drain electrode (including a wiring formed in the same layer as the source electrode and the drain electrode) is formed over the insulating film 102 and processed to form the source electrode 104a and the drain electrode 104b (see FIG. 2C). Note that the channel length L of the transistor is determined by the distance between the edges of the source electrode 104a and the drain electrode 104b which are formed here.

As the conductive film used for the source electrode 104a and the drain electrode 104b, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like may be used. Alternatively, a conductive film may be used in which a high-melting-point metal film of Ti, Mo, W, or the like or a metal nitride film of any of these elements (a titanium nitride film, a molybdenum nitride film, or a tungsten nitride film)

may be stacked on one of or both a bottom side and a top side of a metal film of Al, Cu, or the like.

Alternatively, the conductive film used for the source electrode 104a and the drain electrode 104b may be formed using a conductive metal oxide. As the conductive metal oxide, indium oxide, tin oxide, zinc oxide, an indium oxide-tin oxide mixed oxide (abbreviated to ITO), an indium oxide-zinc oxide mixed oxide, or any of these metal oxide materials containing silicon oxide may be used.

The conductive film may be processed by etching with the use of a resist mask. Ultraviolet, a KrF laser light, an ArF laser light, or the like is preferably used for light exposure for forming a resist mask for the etching.

In the case where the channel length L is less than 25 nm, the light exposure at the time of forming the resist mask is preferably performed using, for example, extreme ultraviolet having an extremely short wavelength of several nanometers to several tens of nanometers. In the light exposure using extreme ultraviolet, the resolution is high and the focus depth is large. Thus, the channel length L of the transistor formed later can be reduced, whereby the operation speed of a circuit can be increased.

An etching step may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask for at least two kinds of patterns can be formed using a multi-tone mask, resulting in simplification of the process Next, an oxide semiconductor film in contact with the source electrode 104a and the drain electrode 104b is formed over the insulating film 102 and then the oxide semiconductor film is processed to form an island-shaped oxide semiconductor film 106 (see FIG. 2D).

The oxide semiconductor film is preferably formed by a method by which hydrogen, water, and the like do not easily enter the film, such as a sputtering method. The thickness of the oxide semiconductor film is preferably greater than or equal to 3 nm and less than or equal to 30 nm. This is because the transistor might possibly be normally on when the oxide semiconductor film is too thick (e.g., the thickness is 50 nm or more).

As a material of the oxide semiconductor film, for example, an oxide semiconductor material containing indium or an oxide semiconductor material containing indium and gallium may be used.

As a material of the oxide semiconductor film, any of the following materials can be used: a four-component metal oxide such as an In—Sn—Ga—Zn—O-based material; three-component metal oxides such as an In—Ga—Zn—O-based material, an In—Sn—Zn—O-based material, an In—Al—Zn—O-based material, a Sn—Ga—Zn—O-based material, an Al—Ga—Zn—O-based material, and a Sn—Al—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and single-component metal oxides such as an In—O-based material, a Sn—O-based material, and a Zn—O-based material. In addition, the above materials may contain silicon oxide. Here, for example, an In—Ga—Zn—O-based material means an oxide film containing indium (In), gallium (Ga), and zinc (Zn), and there is no particular limitation on the composition ratio thereof. Further, the In—Ga—Zn—O-based material may contain another element in addition to In, Ga, and Zn.

The oxide semiconductor film may be a thin film formed using a material represented by the chemical formula, $InMO_3(ZnO)_m$ (m>0). Here, M represents one or more metal elements selected from Ga, Al, Mn, and Co. For example, M may be Ga, Ga and Al, Ga and Mn, Ga and Co, or the like.

In this embodiment, the oxide semiconductor film is formed by a sputtering method using an In—Ga—Zn—O-based oxide target.

As the In—Ga—Zn—O-based oxide target, for example, an oxide target with a composition ratio of $In_2O_3:Ga_2O_3:ZnO=1:1:1$ [molar ratio] may be used. Note that it is not necessary to limit the material and the composition ratio of the target to the above. For example, an oxide target a composition ratio of $In_2O_3:Ga_2O_3:ZnO=1:1:2$ [molar ratio] may alternatively be used.

In the case where an In—Zn—O-based material is used for the oxide semiconductor, a target with the following composition ratio is used: the composition ratio of In:Zn is 50:1 to 1:2 in an atomic ratio ($In_2O_3:ZnO=25:1$ to 1:4 in a molar ratio), preferably 20:1 to 1:1 in an atomic ratio ($In_2O_3:ZnO=10:1$ to 2:1 in a molar ratio), further preferably 1.5:1 to 15:1 in an atomic ratio ($In_2O_3:ZnO=3:4$ to 15:2 in a molar ratio). For example, a target used for the formation of an In—Zn—O-based oxide semiconductor has the following atomic ratio: In:Zn:O is X:Y:Z, where Z>1.5X+Y.

The fill rate of the oxide target is higher than or equal to 90% and lower than or equal to 100%, preferably, higher than or equal to 95% and lower than or equal to 99.9%. With the use of the metal oxide target with high fill rate, a dense oxide semiconductor film can be formed.

The deposition atmosphere may be a rare gas (typically argon) atmosphere, an oxygen atmosphere, or a mixed atmosphere containing a rare gas and oxygen. Moreover, it is preferable that an atmosphere using a high-purity gas in which impurities containing hydrogen atoms, such as hydrogen, water, a compound having a hydroxyl group, and a hydride, are removed be used because entry of hydrogen, water, a compound having a hydroxyl group, and a hydride into the oxide semiconductor film can be prevented.

More specifically, for example, the oxide semiconductor film can be formed as follows.

First, the substrate 100 is placed in a deposition chamber kept under reduced pressure, and the substrate temperature is set to a temperature higher than or equal to 100° C. and lower than or equal to 600° C., preferably higher than or equal to 200° C. and lower than or equal to 400° C. This is because the concentration of an impurity contained in the oxide semiconductor film can be reduced when deposition is performed while the substrate 100 is heated. This is also because damage due to sputtering can be reduced.

Then, a high-purity gas in which impurities containing hydrogen atoms, such as hydrogen and moisture, are sufficiently removed is introduced into the deposition chamber from which remaining moisture is being removed, and the oxide semiconductor film is formed over the substrate 100 with the use of the target. To remove moisture remaining in the deposition chamber, an entrapment vacuum pump such as a cryopump, an ion pump, or a titanium sublimation pump is preferably used as an evacuation unit. Further, an evacuation means may be a turbo molecular pump provided with a cold trap. In the deposition chamber which is evacuated with the cryopump, a hydrogen molecule, a compound containing a hydrogen atom, such as water ($H_2O$), (further preferably, also a compound containing a carbon atom), and the like are removed, whereby the concentration of an impurity in the oxide semiconductor film formed in the deposition chamber can be reduced.

An example of the deposition conditions is as follows: the distance between the substrate and the target is 100 mm, the pressure is 0.6 Pa, the direct-current (DC) power is 0.5 kW, and the deposition atmosphere is an oxygen atmosphere (the flow rate of the oxygen is 100%). Note that a pulse direct current power source is preferable because generation of powdery substances (also referred to as particles or dust) in deposition can be suppressed and thickness distribution can be uniform.

The oxide semiconductor film can be processed in such a manner that a mask having a desired shape is formed over the oxide semiconductor film and then the oxide semiconductor film is etched. The mask may be formed by a method such as photolithography or an ink-jet method.

For the etching of the oxide semiconductor film, either wet etching or dry etching may be employed. Needless to say, both of them may be employed in combination.

Figure 2E:
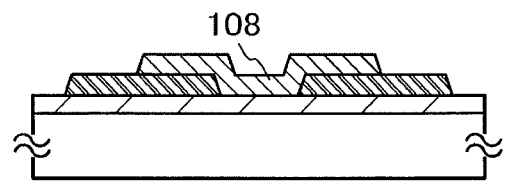

After that, heat treatment is performed on the oxide semiconductor film 106, so that the highly purified oxide semiconductor film 108 is formed (see FIG. 2E). Hydrogen (including water and a hydroxyl group) in the oxide semiconductor film 106 is removed through the heat treatment and the structure of the oxide semiconductor film is rearranged, so that defect levels in an energy gap can be reduced. The heat treatment is performed at a temperature higher than or equal to 250° C. and lower than or equal to 650° C., preferably higher than or equal to 450° C. and lower than or equal to 600° C., or lower than the strain point of the substrate.

The heat treatment may be performed, for example, in such a manner that an object to be processed is introduced into an electric furnace in which a resistance heating element or the like is used and heated in a nitrogen atmosphere at 450° C. for an hour. During the heat treatment, the oxide semiconductor film 106 is not exposed to the air to prevent the entry of water and hydrogen.

A heat treatment apparatus is not limited to an electric furnace and may be an apparatus for heating an object by thermal radiation or thermal conduction from a medium such as a heated gas. For example, an RTA (rapid thermal anneal) apparatus such as an LRTA (lamp rapid thermal anneal) apparatus or a GRTA (gas rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp A GRTA apparatus is an apparatus for performing heat treatment using a high-temperature gas.

For example, as the heat treatment, GRTA treatment may be performed as follows. The object is put in an inert gas atmosphere that has been heated, heated for several minutes, and then taken out of the inert gas atmosphere. GRTA treatment enables high-temperature heat treatment in a short time. Moreover, GRTA treatment can be employed even when the temperature exceeds the upper temperature limit of the object. Note that the inert gas may be switched to a gas containing oxygen during the treatment. This is because the number of defect levels in an energy gap due to oxygen deficiency can be reduced by performing the heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

In any case, the i-type (intrinsic) or substantially i-type oxide semiconductor film in which impurities are reduced by the heat treatment is formed, whereby a transistor having extremely excellent characteristics can be realized.

The above heat treatment can be referred to as dehydration treatment, dehydrogenation treatment, or the like because of its advantageous effect of removing hydrogen, water, and the like. The dehydration treatment or dehydrogenation treatment may be performed at the timing, for example, before the oxide semiconductor film is processed to have an island shape. Such dehydration treatment or dehydrogenation treatment may be conducted once or plural times.

Figure 2F:
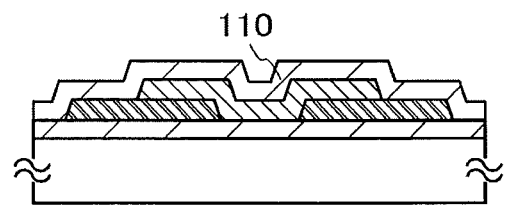

Then, the gate insulating film 110 is formed in contact with the oxide semiconductor film 108 so as to cover the source electrode 104a and the drain electrode 104b (see FIG. 2F).

The gate insulating film 110 can be formed in a mariner similar to that of the insulating film 102. That is, the gate insulating film 110 may be formed using silicon oxide, silicon nitride, aluminum oxide, aluminum nitride, gallium oxide, a mixed material thereof, or the like. Note that a material having a high dielectric constant, such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added may be used for the gate insulating film 110 considering the function of the gate insulating film of the transistor.

As in the case of the insulating film 102, a layered structure may be employed. In that case, it is preferable to employ a layered structure of a film formed using an insulating material containing a component which is the same as a component of the oxide semiconductor film (hereinafter referred to as a film a) and a film containing a material different from a constituent material of the film a (hereinafter referred to as a film b). The reason is as follows. When the gate insulating film 110 has such a structure in which the film a and the film b are sequentially stacked from the oxide semiconductor film side, charge is trapped preferentially at the interface between the film a and the film b (compared with the interface between the oxide semiconductor film and the film a). Thus, trapping of charge at the interface of the oxide semiconductor film can be sufficiently suppressed, resulting in higher reliability of the semiconductor device.

Note that as such a layered structure, a layered structure of a gallium oxide film and a silicon oxide film, a layered structure of a gallium oxide film and a silicon nitride film, or the like may be used.

Heat treatment is preferably performed after formation of the gate insulating film 110. The heat treatment is performed at a temperature of higher than or equal to 250° C. and lower than or equal to 700° C., preferably higher than or equal to 450° C. and lower than or equal to 600° C. or lower than the strain point of the substrate.

The heat treatment may be performed under an atmosphere of nitrogen, oxygen, an ultra dry air (the moisture amount is less than or equal to 20 ppm (−55° C. by conversion into a dew point), preferably less than or equal to 1 ppm, far preferably less than or equal to 10 ppb, in the measurement with the use of a dew point meter of a cavity ring down laser spectroscopy (CRDS) system), or a rare gas (argon, helium, or the like). The atmosphere of nitrogen, oxygen, the ultra dry air, or the rare gas preferably contains an impurity water, hydrogen, or the like as less as possible. The purity of nitrogen, oxygen, or the rare gas which is introduced into the heat treatment apparatus is set to preferably 6N (99.9999%) or higher, far preferably 7N (99.99999%) or higher (that is, the impurity concentration is preferably 1 ppm or lower, far preferably 0.1 ppm or lower).

The heat treatment in this embodiment is performed while the oxide semiconductor film 108 and the gate insulating film 110 are in contact with each other. Thus, oxygen, which may be reduced due to the dehydration (or dehydrogenation) treatment, can be supplied to the oxide semiconductor film 108. In this sense, the heat treatment can also be referred to as supply of oxygen.

Note that there is no particular limitation on the timing of the heat treatment for supply of oxygen as long as it is after formation of the oxide semiconductor film 108. For example, the heat treatment for supply of oxygen may be performed after forming the gate electrode. The heat treatment for supply of oxygen may be performed following to heat treatment for dehydration or the like; heat treatment for dehydration or the like may also serve as the heat treatment for supplying oxygen; the heat treatment for supply of oxygen may also serve as heat treatment for dehydration or the like.

As described above, the heat treatment for dehydration or the like and oxygen doping treatment or the heat treatment for supply of oxygen are applied, whereby the oxide semiconductor film 108 can be highly purified so as to contain impurities as little as possible. The highly purified oxide semiconductor film 108 contains extremely few (close to zero) carriers derived from a donor.

Figure 2G:
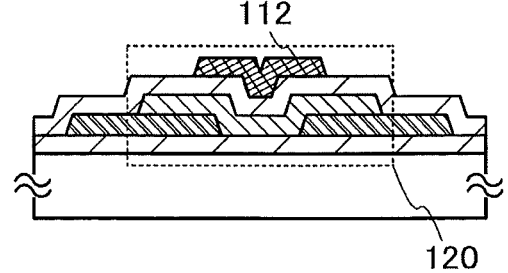

Then, the gate electrode 112 is formed (see FIG. 2G). The gate electrode 112 can be formed using a metal material such as molybdenum, titanium, tantalum, tungsten, aluminum, copper, neodymium, or scandium or an alloy material which contains any of these materials as its main component. Note that the gate electrode 112 may have a single-layer structure or a layered structure.

Note that an insulating film may be formed after formation of the gate electrode 112. The insulating film may be formed using silicon oxide, silicon nitride, aluminum oxide, aluminum nitride, gallium oxide, a mixed material of thereof, or the like. In particular, a silicon nitride film is preferable as the insulating film because added oxygen can be prevented from being released to the outside, and hydrogen or the like from the outside can be effectively prevented from entering the oxide semiconductor film 108. A wiring connected to the source electrode 104a, the drain electrode 104b, the gate electrode 112, or the like may be formed.

Through the above process, the transistor 120 is formed.

Note that the above description gives the example in which oxygen doping treatment is performed on the entire surface of the insulating film 102; however, an embodiment of the disclosed invention is not limited thereto. For example, oxygen doping treatment may be performed after the source electrode 104a and the drain electrode 104b are formed. In that case, a high-oxygen-concentration region and a low-oxygen-concentration region are formed in the insulating film 102.

<Modified Example of Semiconductor Device>

FIGS. 3A to 3D are cross-sectional views of a transistor 130, a transistor 140, a transistor 150, and a transistor 160 as modified examples of the transistor 120 in FIGS. 1A to 1C.

Figure 3A:
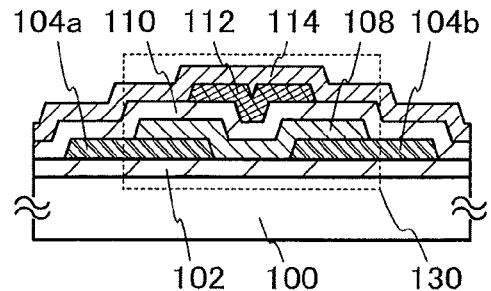
FIGS. 3A to 3D each illustrate an embodiment of a semiconductor device.

The transistor 130 in FIG. 3A is the same as the transistor 120 in that it includes the insulating film 102, the source electrode 104a, the drain electrode 104b, the oxide semiconductor film 108, the gate insulating film 110, and the gate electrode 112. The difference between the transistor 130 and the transistor 120 is the presence of the insulating film 114 covering the above components. That is, the transistor 130 includes the insulating film 114. The other components are the same as those of the transistor 120 in FIGS. 1A to 1C; thus, the description of FIGS. 1A to 1C can be referred to for the details thereof.

As described in FIG. 2G, the insulating film 114 can be formed using silicon oxide, silicon nitride, aluminum oxide, aluminum nitride, gallium oxide, a mixed material of thereof, or the like. In particular, a silicon nitride film is preferable as the insulating film because added oxygen can be prevented from being released to the outside, and hydrogen or the like from the outside can be effectively prevented from entering the oxide semiconductor film 108.

Figure 3B:
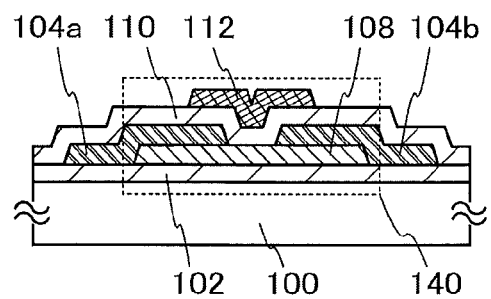

The transistor 140 in FIG. 3B is the same as the transistor 120 of FIGS. 1A to 1C in that it includes the above components. The difference between the transistor 140 and the transistor 120 is the stacking sequence of the source electrode 104a and the drain electrode 104b, and the oxide semiconductor film 108. That is, in the transistor 120, the source electrode 104a and the drain electrode 104b are formed before formation of the oxide semiconductor film 108, whereas in the transistor 140, the oxide semiconductor film 108 is formed before formation of the source electrode 104a and the drain electrode 104b. The other components are the same as those in FIGS. 1A to 1C. Note that the transistor 140 may include the insulating film 114 like the transistor 130.

Figure 3C:
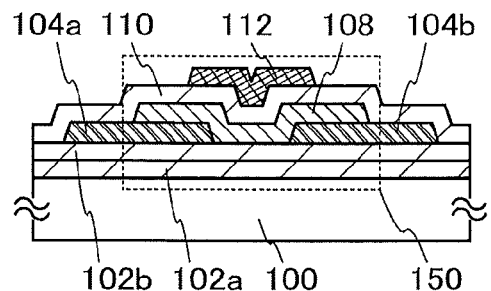

The transistor 150 in FIG. 3C is the same as the transistor 120 of FIGS. 1A to 1C in that it includes the above components. The difference between the transistor 150 and the transistor 120 is the insulating film on the substrate 100 side. In other words, the transistor 150 includes a stack of an insulating film 102a and an insulating film 102b. The other components are the same as those in FIG. 3B.

When the layered structure of the insulating film 102a and the insulating film 102b is employed in this manner, charge is trapped preferentially at the interface between the insulating film 102a and the insulating film 102b. Thus, trapping of charge at the interface of the oxide semiconductor film 108 can be sufficiently suppressed, resulting in higher reliability of a semiconductor device.

Note that it is preferable to than the insulating film 102b with the use of an insulating material containing a component which is the same as a component of the oxide semiconductor film 108 and to form the insulating film 102a containing a material different from a constituent material of the insulating film 102b. For example, in the case where the oxide semiconductor film 108 is formed using an In—Ga—Zn—O-based oxide semiconductor material, gallium oxide or the like is given as such an insulating material containing a component which is the same as a component of the oxide semiconductor film 108. In that case, a layered structure of a gallium oxide film and a silicon oxide film, a layered structure of a gallium oxide film and a silicon nitride film, or the like may be used.

Figure 3D:
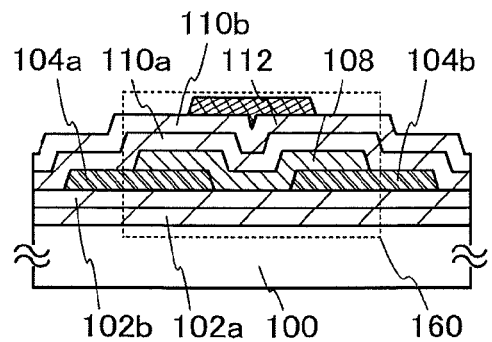

The transistor 160 in FIG. 3D is the same as the transistor 120 of FIGS. 1A to 1C in that it includes the above components. The differences between the transistor 160 and the transistor 120 are the insulating film and the gate insulating film on the substrate 100 side. In other words, the transistor 160 includes a stack of the insulating film 102a and the insulating film 102b and a stack of a gate insulating film 110a and a gate insulating film 110b. The other components are the same as those in FIGS. 1A to 1C.

When the layered structure of the insulating film 102a and the insulating film 102b and the layered structure of the gate insulating film 110a and the gate insulating film 110b are employed, charge is trapped preferentially at the interface between the insulating film 102a and the insulating film 102b and the interface between the gate insulating film 110a and the gate insulating film 110b. Thus, trapping of charge at the interface of the oxide semiconductor film 108 can be sufficiently suppressed, resulting in higher reliability of the semiconductor device.

Note that it is preferable that each of the insulating film 102b and the gate insulating film 110a (namely, the insulating films in contact with the oxide semiconductor film 108) be formed with the use of an insulating material containing a component which is the same as a component of the oxide semiconductor film 108, and the insulating film 102a and the gate insulating film 110b contain materials different from constituent materials of the insulating film 102b and the gate insulating film 110a, respectively. For example, in the case where the oxide semiconductor film 108 is formed using an In—Ga—Zn—O-based oxide semiconductor material, gallium oxide or the like is given as such an insulating material containing a component which is the same as a component of the oxide semiconductor film 108. In this case, a layered structure of a gallium oxide film and a silicon oxide film, a layered structure of a gallium oxide film and a silicon nitride film, or the like may be used.

The transistor according to this embodiment includes a highly-purified and i-type (intrinsic) oxide semiconductor film which is obtained in such a manner that an impurity including a hydrogen atom, such as hydrogen, water, a hydroxyl group, and hydride (also referred to as a hydrogen compound), is removed from an oxide semiconductor by heat treatment, and oxygen, which might be reduced in a step for removing an impurity, is supplied. The transistor including the oxide semiconductor film which is highly purified in the above manner has suppressed variation in the electrical characteristics such as a threshold voltage and is electrically stable.

In the case where an oxide semiconductor material which contains In whose bonding strength with oxygen is relatively weak is used for the oxide semiconductor film, when the insulating film in contact with the oxide semiconductor film contains a material which has a stronger bonding strength with oxygen, such as silicon, oxygen in the oxide semiconductor film may be abstracted by heat treatment, which may cause formation of oxygen deficiency in the vicinity of the interface of the oxide semiconductor film. However, in a transistor according to embodiment of the disclosed invention, the formation of oxygen deficiency due to abstraction of oxygen from the oxide semiconductor film can be suppressed by supplying excessive oxygen to the insulating film in contact with the oxide semiconductor film.

In particular, when the amount of oxygen contained in the oxide semiconductor film is increased by oxygen doping treatment, degradation due to electrical bias stress or heat stress can be suppressed and degradation due to light can be reduced.

As described above, according to an embodiment of the disclosed invention, a highly-reliable transistor can be provided.

The structures, the methods, and the like described in this embodiment can be combined as appropriate with any of the structures, the methods, and the like described in the other embodiments.

Embodiment 2

In this embodiment, another example of a method for manufacturing a semiconductor device will be described with reference to FIGS. 4A to 4F and FIGS. 5A to 5C.

<Structural Example of Semiconductor Device>

The structure of a semiconductor device manufactured by the manufacturing method according to this embodiment is the same as that of the transistor 120 of the above embodiment. That is, the semiconductor device includes, over the substrate 100, the insulating film 102, the source electrode 104a, the drain electrode 104b, the oxide semiconductor film 108, the gate insulating film 110, and the gate electrode 112 (see FIGS. 1A to 1C).

As in the description in the above embodiment, in the transistor 120, the insulating film 102 has been subjected to oxygen doping treatment. Further, in this embodiment, oxygen doping treatment is also performed on the oxide semiconductor film 108 and the gate insulating film 110. By such oxygen doping treatment, the transistor 120 with improved reliability can be obtained. Note that in a similar to the above embodiment, transistors having different structures can also be manufactured (see FIGS. 3A to 3D).

<Example of Manufacturing Process of Semiconductor Device>

An example of a manufacturing process of the semiconductor device will be described below with reference to FIGS. 4A to 4F and FIGS. 5A to 5C.

Figure 4A:
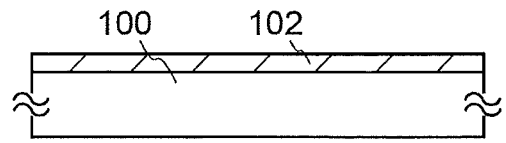
FIGS. 4A to 4F illustrate an embodiment of a method for manufacturing a semiconductor device.

First, the insulating film 102 is formed over the substrate 100 (see FIG. 4A).

There is no particular limitation on a material of the substrate 100 as long as the material has at least heat resistance high enough to withstand heat treatment performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may alternatively be used as the substrate 100. When a transistor is provided over the flexible substrate, the transistor may be formed directly on the flexible substrate, or the transistor may be formed over a different substrate and then separated to be transferred to the flexible substrate. In order to separate the transistor to transfer it to the flexible substrate, a separation layer is preferably formed between the different substrate and the transistor.

The insulating film 102 serves as a base. Specifically, the insulating film 102 may be formed using silicon oxide, silicon nitride, aluminum oxide, aluminum nitride, gallium oxide, a mixed material of any of them, or the like. The insulating film 102 may have a single-layer structure or a layered structure using an insulating film including any of the above materials.

There is no particular limitation on the method for forming the insulating film 102. For example, the insulating film 102 may be formed by a deposition method such as a plasma CVD method or a sputtering method. A sputtering method is preferable in terms of low possibility of entry of hydrogen, water, and the like.

Note that it is particularly preferable to form the insulating film 102 with the use of an insulating material containing a component which is the same as a component of an oxide semiconductor film formed later. Such a material is suitable for an oxide semiconductor film; thus, when it is used for the insulating film 102, the state of the interface with the oxide semiconductor film can be kept favorably. Here, containing "a component which is the same as that of an oxide semiconductor film" means containing one or more of elements selected from constituent elements of the oxide semiconductor film. For example, in the case where the oxide semiconductor film is formed using an In—Ga—Zn—O-based oxide semiconductor material, gallium oxide or the like is given as such an insulating material containing a component which is the same as a component of the oxide semiconductor film.

In the case where the insulating film 102 has a layered structure, it is further preferable to employ a layered structure of a film formed using an insulating material containing a component which is the same as a component of the oxide semiconductor film (hereinafter referred to as a film a) and a film containing a material different from a constituent material of the film a (hereinafter referred to as a film b). The reason is as follows. When the insulating film 102 has such a structure in which the film a and the film b are sequentially stacked from the oxide semiconductor film side, charge is trapped preferentially at the interface between the film a and the film b (compared with the interface between the oxide semiconductor film and the film a). Thus, trapping of charge at the interface of the oxide semiconductor film can be sufficiently suppressed, resulting in higher reliability of the semiconductor device.

Note that as such a layered structure, a stack of a gallium oxide film and a silicon oxide film, a stack of a gallium oxide film and a silicon nitride film, or the like may be used.

Figure 4B:
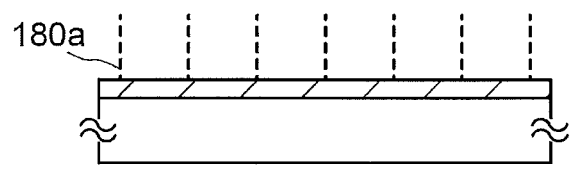

Next, the insulating film 102 is subjected to treatment with oxygen 180a (also referred to as oxygen doping or oxygen plasma doping) (see FIG. 4B). The oxygen 180a contains at least any of an oxygen radical, an oxygen atom, and an oxygen ion. By performing oxygen doping on the insulating film 102, oxygen can be contained in the insulating film 102 and either or both in the oxide semiconductor film 108 formed later or/and in the vicinity of the interface of the oxide semiconductor film 108. In that case, the amount of oxygen contained in the insulating film 102 is greater than the stoichiometric proportion of the insulating film 102, or is preferably greater than the stoichiometric proportion and less than four times of the stoichiometric proportion, more preferably greater than the stoichiometric proportion and less than double of the stoichiometric proportion. Alternatively, the amount of oxygen contained in the insulating film 102 can be greater than Y, or can be preferably greater than Y and less than 4Y, where the amount of oxygen in the case where the material of the insulating film is a single crystal is Y. Still alternatively, the amount of oxygen contained in the insulating film 102 can be greater than Z, and can be preferably greater than Z or less than 4Z based on the amount of oxygen Z in the insulating film in the case where oxygen doping treatment is not performed.

For example, in the case where gallium oxide whose composition is represented by $GaO_x$ (x>0) is used, since a single crystal of gallium oxide is $Ga_2O_3$, x can be greater than 1.5 and less than 6 (i.e., the amount of O is greater than 1.5 times of Ga and less than 6 times of Ga). Note that such an oxygen excessive region may exist in part of the insulating film. Alternatively, for example, in the case where silicon oxide whose composition is represented by $SiO_x$ (x>0) is used, when $SiO_2$ (i.e., the amount of O is double of that of Si) is employed, x is greater than 2 and less than 8 (i.e., the amount of O is greater than double of that of Si and less than 8 times of that of Si). Note that such an oxygen excessive region may exist in part of the insulating film (including its interface).

In addition, at least part of the oxygen 180a added to the insulating film preferably has a dangling bond in the oxide semiconductor film after being supplied to the oxide semiconductor. This is because, with the dangling bond, the oxygen 180a can be bonded with hydrogen which remains in the film, so that the hydrogen can be fixed (made to be an immovable ion).

The oxygen 180a can be generated by a plasma generating apparatus or an ozone generating apparatus. More specifically, for example, an apparatus for etching of a semiconductor device, an apparatus for ashing of a resist mask, or the like can be used to generate the oxygen 180a, and the insulating film 102 can be processed.

Note that it is preferable to apply an electrical bias to the substrate in order to perform oxygen doping more favorably.

Figure 4C:
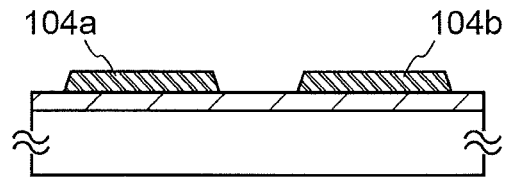

Next, a conductive film for forming the source electrode and the drain electrode (including a wiring formed in the same layer as the source electrode and the drain electrode) is formed over the insulating film 102 and the conductive film is processed to form the source electrode 104a and the drain electrode 104b (see FIG. 4C). Note that the channel length L of the transistor is determined by the distance between the edges of the source electrode 104a and the drain electrode 104b which are formed here.

Examples of the conductive film used for the source electrode 104a and the drain electrode 104b are a metal film containing an element selected from Al, Cr, Cu, Ta, Ti, Mo, and W, and a metal nitride film containing any of the above elements as its component (e.g., a titanium nitride film, a molybdenum nitride film, and a tungsten nitride film). Alternatively, a conductive film may be used in which a high-melting-point metal film of Ti, Mo, W, or the like or a metal nitride film of any of these elements (a titanium nitride film, a molybdenum nitride film, or a tungsten nitride film) may be stacked on one of or both a bottom side and a top side of a metal film of Al, Cu, or the like.

Alternatively, the conductive film used for the source electrode 104a and the drain electrode 104b may be formed using a conductive metal oxide. As the conductive metal oxide, indium oxide, tin oxide, zinc oxide, an indium oxide-tin oxide mixed oxide (abbreviated to ITO), an indium oxide-zinc oxide mixed oxide, or any of these metal oxide materials containing silicon oxide may be used.

The conductive film may be processed by etching with the use of a resist mask. Ultraviolet, a KrF laser light, an ArF laser light, or the like is preferably used for light exposure for forming a resist mask for the etching.

In the case where the channel length L is less than 25 nm, the light exposure at the time of forming the resist mask is preferably performed using, for example, extreme ultraviolet having an extremely short wavelength of several nanometers to several tens of nanometers. In the light exposure using extreme ultraviolet, the resolution is high and the focus depth is large. Thus, the channel length L of the transistor formed later can be reduced, whereby the operation speed of a circuit can be increased.

An etching step may be performed with the use of a resist mask formed using a so-called multi-tone mask. A resist mask formed using a multi-tone mask has a plurality of thicknesses and can be further changed in shape by aching; thus, such a resist mask can be used in a plurality of etching steps for different patterns. Therefore, a resist mask for at least two kinds of patterns can be formed using a multi-tone mask, resulting in simplification of the process.

Figure 4D:
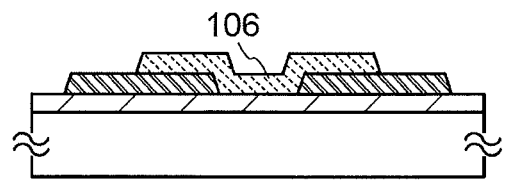

Next, an oxide semiconductor film in contact with the source electrode 104a and the drain electrode 104b is formed over the insulating film 102 and then the oxide semiconductor film is processed to form an oxide semiconductor film 106 having an island shape (see FIG. 4D).

The oxide semiconductor film is preferably formed by a method by which hydrogen, water, and the like do not easily enter the film, such as a sputtering method. The thickness of the oxide semiconductor film is preferably greater than or equal to 3 nm and less than or equal to 30 nm. This is because the transistor might possibly be normally on when the oxide semiconductor film is too thick (e.g., the thickness is 50 nm or more).

As a material of the oxide semiconductor film, any of the following materials can be used: a four-component metal oxide such as an In—Sn—Ga—Zn—O-based material; three-component metal oxides such as an In—Ga—Zn—O-based material, an In—Sn—Zn—O-based material, an In—Al—Zn—O-based material, a Sn—Ga—Zn—O-based material, an Al—Ga—Zn—O-based material, and a Sn—Al—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and single-component metal oxides such as an In—O-based material, a Sn—O-based material, and a Zn—O-based material. In addition, the above materials may contain silicon oxide. Here, for example, an In—Ga—Zn—O-based material means an oxide film containing indium (In), gallium (Ga), and zinc (Zn), and there is no particular limitation on the composition ratio thereof. Further, the In—Ga—Zn—O-based material may contain another element in addition to In, Ga, and Zn.

The oxide semiconductor film may be a thin film formed using a material represented by the chemical formula, $InMO_3(ZnO)_m$ (m>0, and m is not a natural number). Here, M represents one or more metal elements selected from Ga, Al, Mn, and Co. For example, M may be Ga, Ga and Al, Ga and Mn, Ga and Co, or the like.

In this embodiment, the oxide semiconductor film is formed by a sputtering method using an In—Ga—Zn—O-based oxide target.

As the In—Ga—Zn—O-based oxide semiconductor deposition target, for example, an oxide target with a composition ratio of $In_2O_3:Ga_2O_3:ZnO=1:1:1$ [molar ratio] may be used. Note that it is not necessary to limit the material and the composition ratio of the target to the above. For example, an oxide target with a composition ratio of $In_2O_3:Ga_2O_3:ZnO=1:1:2$ [molar ratio] may alternatively be used.

The fill rate of the oxide semiconductor deposition target is higher than or equal to 90% and lower than or equal to 100%, preferably, higher than or equal to 95% and lower than or equal to 99.9%. With the use of the metal oxide target with high fill rate, a dense oxide semiconductor film can be formed.

The deposition atmosphere may be a rare gas (typically argon) atmosphere, an oxygen atmosphere, or a mixed atmosphere containing a rare gas and oxygen. Moreover, it is preferable that an atmosphere using a high-purity gas in which impurities containing hydrogen atoms, such as hydrogen, water, a compound with a hydroxyl group, and a hydride, are removed be used because entry of hydrogen, water, a compound with a hydroxyl group, and a hydride into the oxide semiconductor film can be prevented.

In forming the oxide semiconductor film, oxygen in the insulating film 102 is supplied to the oxide semiconductor film in some cases. When oxygen is added to the insulating film 102 in this manner, it is possible to form the oxide semiconductor film to which oxygen is sufficiently added.

More specifically, for example, the oxide semiconductor film can be formed as follows:

First, the substrate 100 is placed in a deposition chamber kept under reduced pressure, and the substrate temperature is set to a temperature higher than or equal to 100° C. and lower than or equal to 600° C., preferably higher than or equal to 200° C. and lower than or equal to 400° C. This is because the concentration of an impurity contained in the oxide semiconductor film can be reduced when deposition is performed while the substrate 100 is heated. This is also because damage due to sputtering can be reduced.

Then, a high-purity gas in which impurities containing hydrogen atoms, such as hydrogen and moisture, are sufficiently removed is introduced into the deposition chamber from which remaining moisture is being removed, and the oxide semiconductor an is formed over the substrate 100 with the use of the target. To remove moisture remaining in the deposition chamber, an entrapment vacuum pump such as a cryopump, an ion pump, or a titanium sublimation pump is preferably used as an evacuation unit. Further, an evacuation means may be a turbo molecular pump provided with a cold trap. In the deposition chamber which is evacuated with the cryopump, a hydrogen molecule, a compound containing a hydrogen atom, such as water ($H_2O$), (further preferably, also a compound containing a carbon atom), and the like are removed, whereby the concentration of an impurity in the oxide semiconductor film formed in the deposition chamber can be reduced.

An example of the deposition conditions is as follows: the distance between the substrate and the target is 100 mm, the pressure is 0.6 Pa, the direct-current (DC) power is 0.5 kW, and the deposition atmosphere is an oxygen atmosphere (the flow rate of the oxygen is 100%). Note that a pulse direct current power source is preferable because generation of powdery substances (also referred to as particles or dust) in deposition can be prevented and thickness distribution can be uniform.

The oxide semiconductor film can be processed in such a manner that a mask having a desired shape is formed over the oxide semiconductor film and then the oxide semiconductor film is etched. The mask may be formed by a method such as photolithography or an ink-jet method.

For the etching of the oxide semiconductor film, either wet etching or dry etching may be employed. Needless to say, both of them may be employed in combination.

Figure 4E:
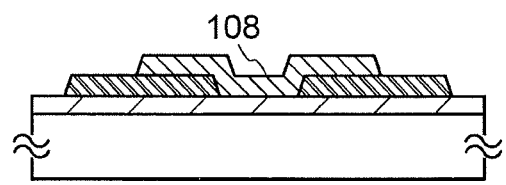

After that, heat treatment is performed on the oxide semiconductor film 106 so that the highly purified oxide semiconductor film 108 is formed (see FIG. 4E). Hydrogen (including water and a hydroxyl group) in the oxide semiconductor film 106 is removed through the heat treatment and the structure of the oxide semiconductor film is rearranged, so that defect levels in an energy gap can be reduced. Further, through this heat treatment, oxygen in the insulating film 102 is supplied to the oxide semiconductor film in some cases. The heat treatment is performed at a temperature of higher than or equal to 250° C. and lower than or equal to 650° C., preferably higher than or equal to 450° C. and lower than or equal to 600° C. or lower than the strain point of the substrate.

The heat treatment may be performed, for example, in such a manner that an object to be processed is introduced into an electric furnace in which a resistance heating element or the like is used and heated in a nitrogen atmosphere at 450° C. for an hour. During the heat treatment, the oxide semiconductor film 106 is not exposed to the air to prevent the entry of water and hydrogen.

Note that a heat treatment apparatus is not limited to an electric furnace, and may include a device for heating an object to be processed by heat conduction or heat radiation from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas.

For example, as the heat treatment, GRTA treatment may be performed as follows. The object is put in an inert gas atmosphere that has been heated, heated for several minutes, and then taken out of the inert gas atmosphere. GRTA treatment enables high-temperature heat treatment in a short time. Moreover, GRTA treatment can be employed even when the temperature exceeds the upper temperature limit of the object. Note that the inert gas may be switched to a gas including oxygen during the process. This is because the number of defect levels in an energy gap due to oxygen vacancy can be reduced by performing the heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

In any case, the i-type (intrinsic) or substantially i-type oxide semiconductor film in which impurities are reduced by the heat treatment is formed, whereby a transistor having extremely excellent characteristics can be realized.

The above heat treatment can be referred to as dehydration treatment, dehydrogenation treatment, or the like because of its advantageous effect of removing hydrogen, water, and the like. The dehydration treatment or dehydrogenation treatment may be performed at the timing, for example, before the oxide semiconductor film is processed to have an island shape. Such dehydration treatment or dehydrogenation treatment may be conducted once or plural times.

Figure 4F:
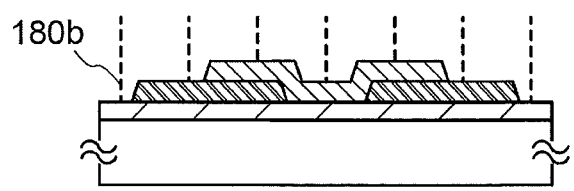

Next, the oxide semiconductor film 108 is subjected to treatment using oxygen 180b (see FIG. 4F). The oxygen 180b contains at least any of an oxygen radical, an oxygen atom, and an oxygen ion. By doping the oxide semiconductor film 108 with oxygen, the oxygen can be contained either or both in the oxide semiconductor film 108 or/and in the vicinity of the interface of the oxide semiconductor film 108. In that case, the amount of oxygen contained in the oxide semiconductor film 108 is greater than the stoichiometric proportion of the oxide semiconductor film 108, preferably greater than the stoichiometric proportion and less than double of the stoichiometric proportion. Alternatively, the amount of oxygen may be greater than Y, preferably greater than Y and less than 2Y, where the amount of oxygen in the case where the material of the oxide semiconductor film 108 is a single crystal is Y. Still alternatively, the amount of oxygen may be greater than Z, preferably greater than Z and less than 2Z based on the amount of oxygen Z in the oxide semiconductor film in the case where oxygen doping is not performed. The reason of the presence of the upper limit in the above preferable range is that the oxide semiconductor film 108 might take hydrogen like a hydrogen storing alloy (hydrogen storage alloy) when the amount of oxygen is too large.

In the case of a material whose crystalline structure is represented by $InGaO_3(ZnO)_m$ ($m>0$), x in $InGaZnO_x$ can be greater than 4 and less than 8 when the crystalline structure where m is 1 ($InGaZnO_4$) is used as the reference, and x in $InGaZn_2O_x$ can be greater than 5 and less than 10 when the crystalline structure where in is 2 ($InGaZn_2O_5$) is used as the reference. Such an oxygen excessive region may exist in part of the oxide semiconductor.

It is preferable that at least part of the oxygen 180b added to the oxide semiconductor film have dangling bonds in the oxide semiconductor film. This is because such dangling bonds are bonded with hydrogen remaining in the film so that hydrogen can be fixed (made to be immovable ions).

The oxygen 180b can be generated by a plasma generating apparatus or an ozone generating apparatus. More specifically, for example, an apparatus for etching of a semiconductor device, an apparatus for ashing of a resist mask, or the like can be used to generate and the oxygen 180b and process the oxide semiconductor film 108.

Note that it is preferable to apply an electrical bias to the substrate in order to add oxygen more favorably.

Heat treatment (at a temperature of 150° C. to 470° C.) may be performed on the oxide semiconductor film 108 which has been subjected to oxygen doping treatment. Through the heat treatment, water, a hydroxyl group (OH), and the like generated by reaction between hydrogen and the material of the oxide semiconductor can be removed from the oxide semiconductor film. The heat treatment may be performed in an atmosphere of nitrogen, oxygen, an ultra-dry air (an air where the moisture content is 20 ppm or less, preferably 1 ppm or less, further preferably 10 ppb or less), a rare gas (e.g., argon or helium), or the like in which moisture, hydrogen, and the like are sufficiently reduced. Further, the oxygen doping treatment and the heat treatment may be repeated. By repeatedly performing the oxygen doping treatment and the heat treatment, the transistor can have higher reliability. The number of repetitions can be set appropriately.

Figure 5A:
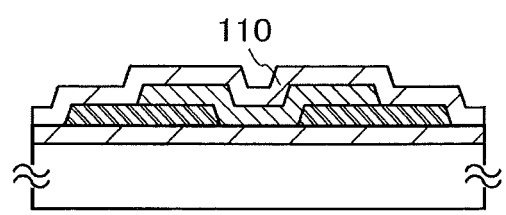
FIGS. 5A to 5C illustrate an embodiment of a method for manufacturing a semiconductor device.

Then, the gate insulating film 110 is formed in contact with part of the oxide semiconductor film 108 so as to cover the source electrode 104a and the drain electrode 104b (see FIG. 5A).

The gate insulating film 110 can be formed in a manner similar to that of the insulating film 102. That is, the gate insulating film 110 may be formed using silicon oxide, silicon nitride, aluminum oxide, aluminum nitride, gallium oxide, a mixed material thereof, or the like. Note that a material having a high dielectric constant, such as hafnium oxide, tantalum oxide, yttrium oxide, hafnium silicate ($HfSi_xO_y$ ($x>0$, $y>0$), hafnium silicate ($HfSi_xO_y$ ($x>0$, $y>0$) to which nitrogen is added, or hafnium aluminate ($HfSi_xO_y$ ($x>0$, $y>0$) to which nitrogen is added may be used for the gate insulating film 110 considering the function of the gate insulating film of the transistor.

As in the case of the insulating film 102, a layered structure may be employed. In that case, it is preferable to employ a layered structure of a film formed using an insulating material containing a component which is the same as a component of the oxide semiconductor film (hereinafter referred to as a film a) and a film containing a material different from a constituent material of the film a (hereinafter referred to as a film b). The reason is as follows. When the gate insulating film 110 has such a structure in which the film a and the film b are sequentially stacked from the oxide semiconductor film side, charge is trapped preferentially at the interface between the film a and the film b (compared with the interface between the oxide semiconductor film and the film a). Thus, trapping of charge at the interface with the oxide semiconductor film can be sufficiently suppressed, resulting in higher reliability of the semiconductor device.

Note that as such a layered structure, a layered structure of a gallium oxide film and a silicon oxide film, a layered structure of a gallium oxide film and a silicon nitride film, or the like may be used.

Heat treatment is preferably performed after formation of the gate insulating film 110. The heat treatment is performed at a temperature of higher than or equal to 250° C. and lower than or equal to 700° C., preferably higher than or equal to 450° C. and lower than or equal to 600° C. or lower than the strain point of the substrate.

The heat treatment may be performed in an atmosphere of nitrogen, oxygen, ultra-dry air (air in which a water content is 20 ppm or less, preferably 1 ppm or less, further preferably 10 ppb or less), or a rare gas (argon, helium, or the like). Note that it is preferable that water, hydrogen, and the like be not contained in the atmosphere of nitrogen, oxygen, ultra-dry air, or a rare gas. Further, the purity of nitrogen, oxygen, or a rare gas introduced into a heat treatment apparatus is preferably 6N (99.9999%) or higher (that is, the impurity concentration is 1 ppm or lower), further preferably 7N (99.99999%) or higher (that is, the impurity concentration is 0.1 ppm or lower).

The heat treatment in this embodiment is performed while the oxide semiconductor film 108 is in contact with the insulating film 102 and the gate insulating film 110. Thus, oxygen, which may be reduced due to the dehydration (or dehydrogenation) treatment, can be supplied from the insulating film 102 or the like to the oxide semiconductor film 108. In this sense, the heat treatment can also be referred to as supply of oxygen.

Note that there is no particular limitation on the timing of the heat treatment for supply of oxygen as long as it is after formation of the oxide semiconductor film 108. For example, the heat treatment for supply of oxygen may be performed after forming the gate electrode. The heat treatment for supply of oxygen may be performed following to heat treatment for dehydration or the like; heat treatment for dehydration or the like may also serve as the heat treatment for supplying oxygen; the heat treatment for supply of oxygen may also serve as heat treatment for dehydration or the like.

As described above, the heat treatment for dehydration or the like and oxygen doping treatment or the heat treatment for supply of oxygen are applied, whereby the oxide semiconductor film 108 can be highly purified so as to contain impurities as little as possible. The highly purified oxide semiconductor film 108 contains extremely few (close to zero) carriers derived from a donor.

Figure 5B:
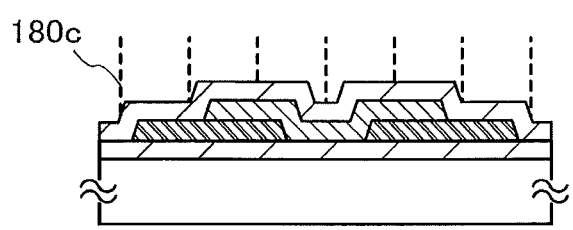

Next, the gate insulating film 110 is subjected to treatment using oxygen 180c (see FIG. 5B). The oxygen 180c contains at least any of an oxygen radical, an oxygen atom, and an oxygen ion. By performing oxygen doping treatment on the gate insulating film 110, oxygen can be contained in either or both in the oxide semiconductor film 108 or/and in the vicinity of the interface of the oxide semiconductor film 108. In that case, the amount of oxygen contained in the gate insulating film 110 is greater than the stoichiometric proportion of the gate insulating film 110, or is preferably greater than the stoichiometric proportion and less than four times of the stoichiometric proportion, more preferably greater than the stoichiometric proportion and less than double of the stoichiometric proportion. Alternatively, the amount of oxygen contained in the gate insulating film 110 can be greater than Y, or can be preferably greater than Y and less than 4Y, where the amount of oxygen in the case where the material of the gate insulating film 110 is a single crystal is Y. Still alternatively, the amount of oxygen contained in the gate insulating film 110 can be greater than Z, and can be preferably greater than Z or less than 4Z based on the amount of oxygen Z in the insulating film in the case where oxygen doping treatment is not performed.

For example, in the case where gallium oxide whose composition is represented by $GaO_x$ (x>0) is used, since a single crystal of gallium oxide is $Ga_2O_3$, x can be greater than 1.5 and less than 6 (i.e., the amount of O is greater than 1.5 times of that of Ga and less than 6 times of that of Ga). Alternatively, for example, in the case where silicon oxide whose composition is represented by $SiO_x$ (x>0) is used, when $SiO_2$ (i.e., the amount of O is double of that of Si) is employed, x is greater than 2 and less than 8 (i.e., the amount of O is greater than double of that of Si and less than 8 times of that of Si). Note that such an oxygen excessive region may exist in part of the insulating film (including its interface).

In addition, at least part of the oxygen 180c added to the insulating film preferably has a dangling bond in the oxide semiconductor film after being supplied to the oxide semiconductor. This is because, with the dangling bond, the oxygen 180c can be bonded with hydrogen which remains in the film, so that the hydrogen can be fixed (made to be an immovable ion).

The oxygen 180c can be generated by a plasma generating apparatus or an ozone generating apparatus. More specifically, for example, an apparatus capable of etching of a semiconductor device, an apparatus capable of ashing of a resist mask, or the like can be used to generate the oxygen 180c, and the gate insulating film 110 is processed.

Note that it is preferable to apply an electrical bias to the substrate in order to perform oxygen doping more favorably.

Note that after the oxygen doping treatment, heat treatment may be performed. By the heat treatment, an excessive amount of oxygen can be supplied to the oxide semiconductor film as compared to hydrogen. There is no limitation on the timing of heat treatment for achieving the effect as long as it is after the oxygen doping treatment. Further, the oxygen doping treatment and the heat treatment may be repeated. By repeatedly performing the oxygen doping treatment and the heat treatment, the transistor can have higher reliability. Note that the number of repetitions can be set appropriately.

Figure 5C:
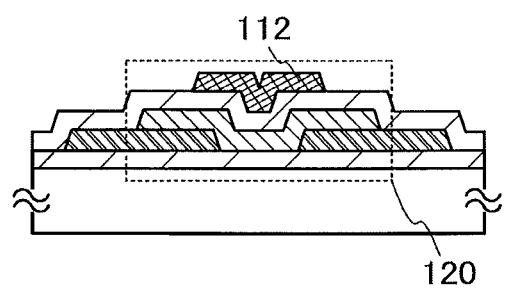

Then, the gate electrode 112 is formed (see FIG. 5C). The gate electrode 112 can be formed using a metal material such as molybdenum, titanium, tantalum, tungsten, aluminum, copper, neodymium, or scandium or an alloy material which contains any of these materials as its main component. Note that the gate electrode 112 may have a single-layer structure or a layered structure.

Note that an insulating film may be formed after formation of the gate electrode 112. The insulating film may be formed using silicon oxide, silicon nitride, aluminum oxide, aluminum nitride, gallium oxide, a mixed material of thereof, or the like. In particular, a silicon nitride film is preferable as the insulating film because added oxygen can be prevented from being released to the outside and hydrogen or the like from the outside can be effectively prevented from being entered the oxide semiconductor film 108. A wiring connected to the source electrode 104a, the drain electrode 104b, the gate electrode 112, or the like may be formed.

Through the above process, the transistor 120 is formed.

Note that the above description gives the example in which oxygen doping treatment is performed on all of the insulating film 102, the oxide semiconductor film 108, and the gate insulating film 110; however, an embodiment of the disclosed invention is not limited thereto. For example, the oxygen doping treatment may be performed on the insulating film 102 and the oxide semiconductor film 108, or on the insulating film 102 and the gate insulating film 110.

The transistor according to this embodiment includes a highly-purified and i-type (intrinsic) oxide semiconductor film which is obtained in such a manner that an impurity including a hydrogen atom, such as hydrogen, water, a hydroxyl group, and a hydride (also referred to as a hydrogen compound), is removed from an oxide semiconductor by heat treatment, and oxygen, which might be reduced in a step for removing an impurity, is supplied. The transistor including the oxide semiconductor film which is highly purified in the above manner has suppressed variation in the electrical characteristics such as a threshold voltage and is electrically stable.

Since the bonding strength between In and oxygen is relatively weak, when an oxide semiconductor material containing In is used as the oxide semiconductor film and the insulating film in contact with the oxide semiconductor film includes a material, such as silicon, whose bonding strength with oxygen is stronger, there is a possibility that oxygen in the oxide semiconductor film is abstracted by heat treatment so that oxygen deficiency is formed in the vicinity of the interface of the oxide semiconductor film. However, in a transistor according to an embodiment of the disclosed invention, oxygen deficiency due to abstraction of oxygen from the oxide semiconductor film can be prevented by supplying an excessive amount of oxygen to the insulating film in contact with the oxide semiconductor film.

In particular, when the amount of oxygen in the oxide semiconductor film is increased by oxygen doping treatment, degradation due to electrical bias stress or thermal stress can be suppressed and degradation due to light can be reduced.

As described above, according to an embodiment of the disclosed invention, a transistor having excellent reliability can be provided.

The structures, the methods, and the like described in this embodiment can be combined as appropriate with any of the structures, methods, and the like described in the other embodiments.

Embodiment 3

In this embodiment, another example of a method for manufacturing a semiconductor device will be described with reference to FIGS. 6A to 6F.

<Structural Example of Semiconductor Device>

The structure of a semiconductor device manufactured in accordance with a method for manufacturing a semiconductor device of this embodiment is the same as that of the transistor 120 of the above embodiment. In other words, the semiconductor device includes, over the substrate 100, the insulating film 102, the source electrode 104a, the drain electrode 104b, the oxide semiconductor film 108, the gate insulating film 110, and the gate electrode 112 (see FIGS. 1 to 1C).

As described in the above embodiment, the insulating film 102 in the transistor 120 is an insulating film subjected to oxygen doping treatment. Further, in this embodiment, oxygen doping treatment is also performed on the oxide semiconductor film 108 and the gate insulating film 110. By such oxygen doping treatment, the transistor 120 which further increases its reliability can be obtained. In addition, the oxygen doping treatment performed on the insulating film 102 in this embodiment also serves as a step for removing a mask 103a and a mask 103b used for forming the source electrode 104a and the drain electrode 104b. By employing such a process, manufacturing cost can be reduced owing to simplification of steps. Note that in a similar to the above embodiment, transistors having different structures can also be manufactured (see FIGS. 3A to 3D).

<Example of Manufacturing Process of Semiconductor Device>

An example of steps for manufacturing the semiconductor device will be described below with reference to FIGS. 6A to 6F. Note that the basic contents of the manufacturing steps are substantially the same as those of the above embodiments; therefore, only different points will be described below.

Figure 6A:
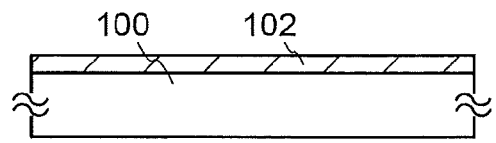
FIGS. 6A to 6F illustrate an embodiment of a method for manufacturing a semiconductor device.
Figure 6B:
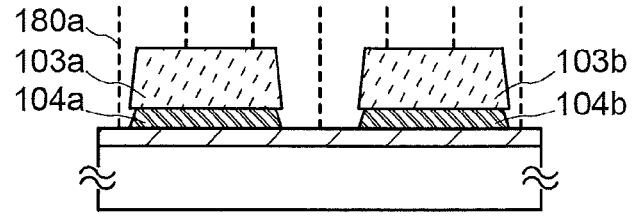
Figure 6C:
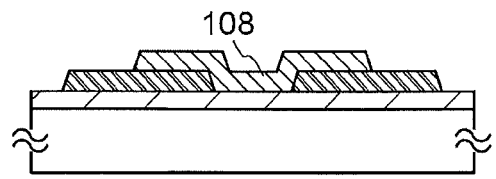

First, the insulating film 102 is formed over the substrate 100 (see FIG. 6A). The description of FIG. 4A can be referred to for the details thereof.

Next, a conductive film for forming the source electrode and the drain electrode (including a wiring formed in the same layer as the source electrode and the drain electrode) is fainted over the insulating film 102 and the conductive film is processed with the use of the mask 103a and the mask 103b, thereby forming the source electrode 104a and the drain electrode 104b. Then, treatment using oxygen 180a (also referred to as oxygen doping treatment or oxygen plasma doping treatment) is performed on the insulating film 102 (see FIG. 6B). The description of FIG. 4C can be referred to for the details of the steps for forming the source electrode 104a and the drain electrode 104b. Here, the oxygen doping treatment also serves as the step for removing the mask 103a and the mask 103b.

The oxygen 180a contains at least any of an oxygen radical, an oxygen atom, and an oxygen ion. By performing oxygen doping treatment on the insulating film 102, oxygen can be contained in the insulating film 102 and either or both in the oxide semiconductor film 108 formed later or/and in the vicinity of the interface of the oxide semiconductor film 108. In that case, the amount of oxygen contained in the insulating film 102 is greater than the stoichiometric proportion of the insulating film 102, or is preferably greater than the stoichiometric proportion and less than four times of the stoichiometric proportion, more preferably greater than the stoichiometric proportion and less than double of the stoichiometric proportion. Alternatively, the amount of oxygen contained in the insulating film 102 can be greater than Y, or can be preferably greater than Y and less than 4Y, where the amount of oxygen in the case where the amount of the insulating film 102 is a single crystal is Y. Still alternatively, the amount of oxygen contained in the insulating film 102 can be greater than Z, and can be preferably greater than Z or less than 4Z based on the amount of oxygen Z in the insulating film in the case where oxygen doping treatment is not performed.

For example, in the case where gallium oxide whose composition is represented by $GaO_x$ (x>0) is used, since a single crystal of gallium oxide is $Ga_2O_3$, x can be greater than 1.5 and less than 6 (i.e., the amount of O is greater than 1.5 times of that of Ga and less than 6 times of that of Ga). Alternatively, for example, in the case where silicon oxide whose composition is represented by $SiO_x$ (x>0) is used, when $SiO_2$ (i.e., the amount of O is double of that of Si) is employed, x is greater than 2 and less than 8 (i.e., the amount of O is greater than double of that of Si and less than 8 times of that of Si). Note that such an oxygen excessive region may exist in part of the insulating film (including its interface).

In addition, at least part of the oxygen 180a added to the insulating film preferably has a dangling bond in the oxide semiconductor film after being supplied to the oxide semiconductor. This is because, with the dangling bond, the oxygen 180a can be bonded with hydrogen which remains in the film, so that the hydrogen can be fixed (made to be an immovable ion).

The oxygen 180a can be generated by a plasma generating apparatus or an ozone generating apparatus. Specifically, for example, the oxygen 180a is generated with the use of an apparatus for ashing of a resist mask or the like, and the insulating film 102 can be processed.

By the oxygen doping treatment, the mask 103a and the mask 103b are removed. Note that, unlike a general step for removing a mask, the step is performed to add oxygen; therefore, it is preferable that a relatively-strong bias be applied to the substrate.

In addition, by the oxygen doping treatment, a region containing oxygen at high concentration and a region containing oxygen at low concentration are formed in the insulating film 102. Specifically, in the insulating film 102, a region which is not covered with the source electrode 104a and the drain electrode 104b is the region containing oxygen at high concentration, and a region which is covered with the source electrode 104a and the drain electrode 104b is the region containing oxygen at low concentration.

Next, an oxide semiconductor film in contact with the source electrode 104a and the drain electrode 104b is formed over the insulating film 102 and the oxide semiconductor film is processed, so that an island-shaped oxide semiconductor film is formed. Then, heat treatment is performed on the island-shaped oxide semiconductor film, whereby the highly-purified oxide semiconductor film 108 is formed (see FIG. 6C). The description of FIGS. 4D and 4E can be referred to for the details of the steps.

Figure 6D:
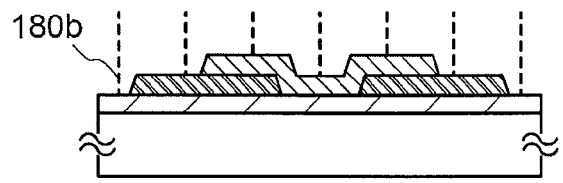
Figure 6E:
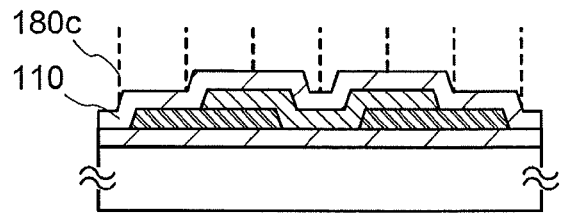

Then, the treatment using oxygen 180b is performed on the oxide semiconductor film 108 (see FIG. 6D). The description of FIG. 4F can be referred to for the details thereof.

Next, the gate insulating film 110 which is in contact with part of the oxide semiconductor film 108 and covers the source electrode 104a and the drain electrode 104b is formed. After that, treatment using oxygen 180c is performed on the gate insulating film 110 (see FIG. 6E). The description of FIGS. 5A and 5B may be referred to for the details thereof.

Figure 6F:
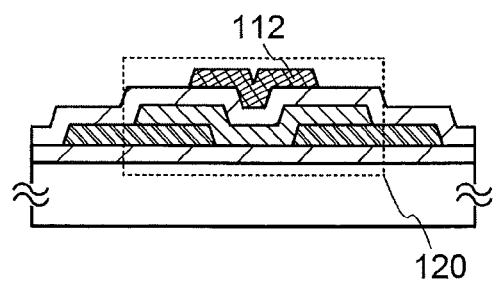

Then, the gate electrode 112 is formed (see FIG. 6F). The description of FIG. 5C can be referred to for the details thereof.

Note that after the gate electrode 112 is formed, an insulating film may be formed. The insulating film can be formed using silicon oxide, silicon nitride, aluminum oxide, aluminum nitride, gallium oxide, or a mixed material thereof, for example. In particular, it is preferable that silicon nitride be used for the insulating film because added oxygen can be prevented from being released to the outside, and hydrogen or the like from the outside can be effectively prevented from entering the oxide semiconductor film 108. In addition, a wiring connected to the source electrode 104a, the drain electrode 104b, or the gate electrode 112 may be formed.

Through the above process, the transistor 120 is formed

Note that the above description gives the example in which oxygen doping treatment is performed on all of the insulating film 102, the oxide semiconductor film 108, and the gate insulating film 110; however, an embodiment of the disclosed invention is not limited thereto. For example, the oxygen doping treatment may be performed on the insulating film 102 and the oxide semiconductor film 108.

The transistor according to this embodiment includes a highly-purified and i-type (intrinsic) oxide semiconductor film which is obtained in such a manner that an impurity including a hydrogen atom, such as hydrogen, water, a hydroxyl group, and hydride (also referred to as a hydrogen compound), is removed from an oxide semiconductor by heat treatment, and oxygen, which might be reduced in a step for removing an impurity, is supplied. The transistor including the oxide semiconductor film which is highly purified in the above manner has suppressed variation in the electrical characteristics such as a threshold voltage and is electrically stable.

Since the bonding strength between In and oxygen is relatively weak, when an oxide semiconductor material containing In is used as the oxide semiconductor film and the insulating film in contact with the oxide semiconductor film includes a material whose bonding strength with oxygen is stronger, such as silicon, there is a possibility that oxygen in the oxide semiconductor film is abstracted by heat treatment so that oxygen deficiency is formed in the vicinity of the interface of the oxide semiconductor film. However, in a transistor according to an embodiment of the disclosed invention, oxygen deficiency due to abstraction of oxygen from the oxide semiconductor film can be prevented by supplying an excessive amount of oxygen to the insulating film in contact with the oxide semiconductor film.

In particular, when the amount of oxygen in the oxide semiconductor film is increased by oxygen doping treatment, degradation due to electrical bias stress or thermal stress can be suppressed and degradation due to light can be reduced.

In addition, according to the manufacturing method of this embodiment, the process is simplified and therefore, cost for manufacture can be reduced.

As described above, according to an embodiment of the disclosed invention, a transistor having excellent reliability can be provided while manufacturing cost is reduced.

The structures, the methods, and the like described in this embodiment can be combined as appropriate with any of the structures, the methods, and the like described in the other embodiments.

Embodiment 4

In this embodiment, an example of a plasma apparatus (also referred to as an ashing apparatus) which can be used for oxygen doping treatment will be described. Note that the apparatus is industrially suitable as compared to an ion implantation apparatus or the like because the apparatus can be applicable for a large-sized glass substrate of the fifth generation or later, for example.

Figure 17A:
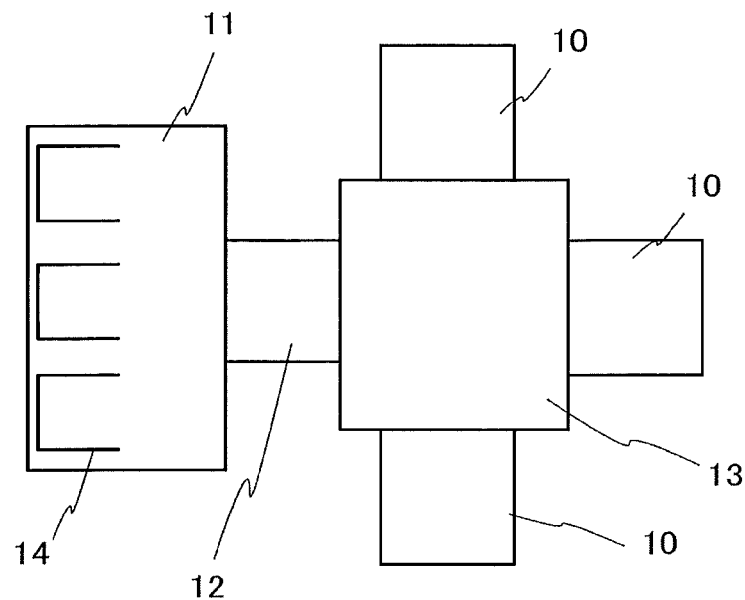
FIGS. 17A and 17B are a top view and a cross-sectional view of a plasma apparatus.
Figure 17B:
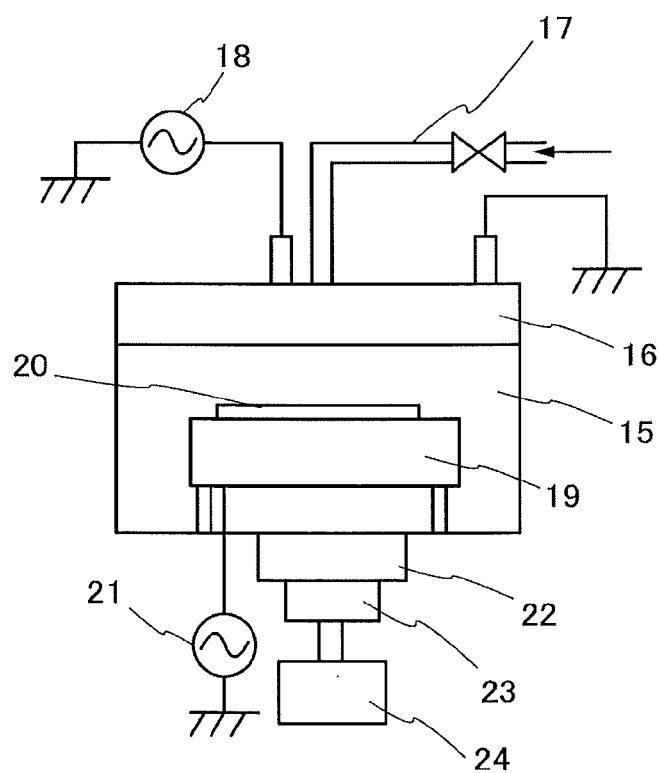

FIG. 17A illustrates an example of a top view of a single wafer multi-chamber equipment. FIG. 17B illustrates an example of a cross-sectional view of a plasma apparatus (also referred to as an ashing apparatus) used for oxygen plasma doping.

The single wafer multi-chamber equipment illustrated in FIG. 17A includes three plasma apparatuses 10 each of which corresponds to FIG. 17B, a substrate supply chamber 11 including three cassette ports 14 for holding a process substrate, a load lock chamber 12, a transfer chamber 13, and the like. A substrate supplied to the substrate supply chamber is transferred through the load lock chamber 12 and the transfer chamber 13 to a vacuum chamber 15 in the plasma apparatus 10 and is subjected to oxygen plasma doping. The substrate which has been subjected to oxygen plasma doping is transferred from the plasma apparatus 10, through the load lock chamber 12 and the transfer chamber 13, to the substrate supply chamber 11. Note that a transfer robot for transferring a process substrate is provided in each of the substrate supply chamber 11 and the transfer chamber 13.

Referring to FIG. 17B, the plasma apparatus 10 includes the vacuum chamber 15. A plurality of gas outlets and an ICP coil (an inductively coupled plasma coil) 16 which is a generation source of plasma are provided on a top portion of the vacuum chamber 15.

The twelve gas outlets are arranged in a center portion, seen from the top of the plasma apparatus 10. Each of the gas outlets is connected to a gas supply source for supplying an oxygen gas, through a gas flow path 17. The gas supply source includes a mass flow controller and the like and can supply an oxygen gas to the gas flow path 17 at a desired flow rate (which is greater than 0 sccm and less than or equal to 1000 sccm). The oxygen gas supplied from the gas supply source is supplied from the gate flow path 17, through the twelve gas outlets, into the vacuum chamber 15.

The ICP coil 16 includes a plurality of strip-like conductors each of which has a spiral form. One end of each of the conductors is electrically connected to a first high-frequency power source 18 (13.56 MHz) through a matching circuit for controlling impedance, and the other end thereof is grounded.

A substrate stage 19 functioning as a bottom electrode is provided in a lower portion of the vacuum chamber. By an electrostatic chuck or the like provided for the substrate stage 19, a process substrate 20 is held on the substrate stage so as to be detachable. The substrate stage 19 is provided with a heater as a heating system and a He gas flow pass as a cooling system. The substrate stage is connected to a second high-frequency power source 21 (3.2 MHz) for applying a substrate bias voltage.

In addition, the vacuum chamber 15 is provided with an exhaust port and an automatic pressure control valve (also referred to as an APC) 22. The APC is connected to a turbo molecular pump 23 and further, connected to a dry pump 24 through the turbo molecular pump 23. The APC controls the inside pressure of the vacuum chamber. The turbo molecular pump 23 and the dry pump 24 reduce the inside pressure of the vacuum chamber 15.

Next, described is an example in which plasma is generated in the vacuum chamber 15 illustrated in FIG. 17B, and oxygen plasma doping is performed on an oxide semiconductor film, a base insulating film, or a gate insulating film provided for the process substrate 20.

First, the inside pressure of the vacuum chamber 15 is held at a desired pressure by operating the turbo molecular pump 23, the dry pump 24, and the like, and then, the process substrate 20 is installed on the substrate stage in the vacuum chamber 15. Note that the process substrate 20 held on the substrate stage has at least an oxide semiconductor film or a base insulating film. In this embodiment, the inside pressure of the vacuum chamber 15 is held at 1.33 Pa. Note that the flow rate of the oxygen gas supplied from the gas outlets into the vacuum chamber 15 is set at 250 sccm.

Next, a high-frequency power is applied from the first high-frequency power source 18 to the ICP coil 16, thereby generating plasma. Then, a state in which plasma is being generated is kept for a certain period (greater than or equal to 30 seconds and less than or equal to 600 seconds). Note that the high-frequency power applied to the ICP coil 16 is greater than or equal to 1 kW and less than or equal to 10 kW. In this embodiment, the high-frequency power is set at 6000 W. At this time, a substrate bias voltage may be applied from the second high-frequency power source 21 to the substrate stage. In this embodiment, the power used for applying the substrate bias voltage is set at 1000 W.

In this embodiment, the state in which plasma is being generated is kept for 60 seconds and then, the process substrate 20 is transferred from the vacuum chamber 15. In this manner, oxygen plasma doping can be performed on the oxide semiconductor film, the base insulating film, or the gate insulating film provided for the process substrate 20.

The structures, the methods, and the like described in this embodiment can be combined as appropriate with any of the structures, the methods, and the like described in the other embodiments.

Embodiment 5

In this embodiment, as an example of a semiconductor device, a memory medium (a memory element) will be described. In this embodiment, the transistor including an oxide semiconductor described in any of Embodiments 1 to 3 or the like and a transistor including a material other than an oxide semiconductor are formed over one substrate.

Figure 7A:
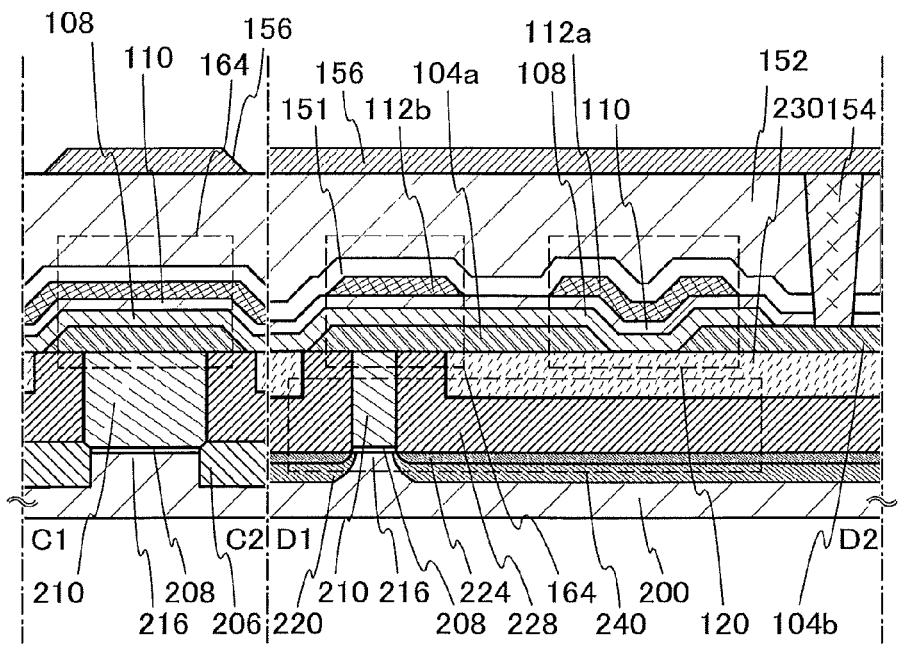
FIGS. 7A to 7C are a cross-sectional view, a top view, and a circuit diagram of a semiconductor device, respectively.
Figure 7B:
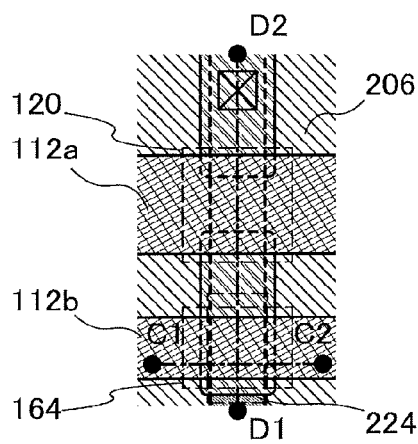
Figure 7C:
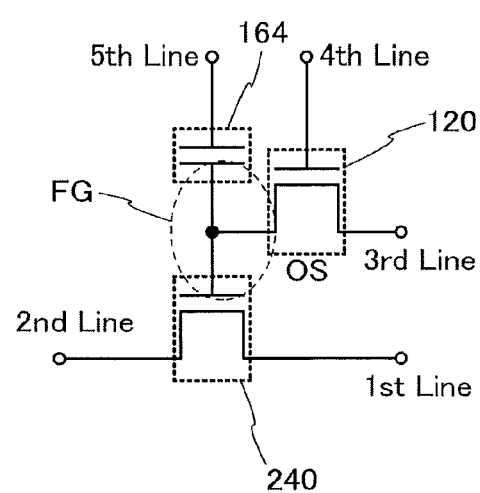

FIGS. 7A to 7C illustrate an example of a structure of a semiconductor device. FIG. 7A illustrates a cross section of the semiconductor device, and FIG. 7B illustrates a plan view of the semiconductor device. Here, FIG. 7A corresponds to a cross section taken along lines C1-C2 and D1-D2 of FIG. 7B. FIG. 7C illustrates an example of a diagram of a circuit including the semiconductor device as a memory element. In the semiconductor device illustrated in FIGS. 7A and 7B, a transistor 240 including a first semiconductor material is provided in a lower portion, and the transistor 120 described in Embodiment 1 is provided in an upper portion. Note that the transistor 120 includes an oxide semiconductor as a second semiconductor material. In this embodiment, the first semiconductor material is a semiconductor material other than an oxide semiconductor. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material other than an oxide semiconductor can easily achieve high-speed operation. On the other hand, a transistor including an oxide semiconductor can hold charge for a long time owing to its characteristics.

Note that in this embodiment, an example in which the memory medium is formed using the transistor 120 is described; however, needless to say, any of the transistors 130 to 160, and the like described in Embodiment 1 or 2 can be used instead of the transistor 120.

The transistor 240 in FIGS. 7A to 7C includes a channel formation region 216 provided in a substrate 200 including a semiconductor material (e.g., silicon), impurity regions 220 between which the channel formation region 216 is provided, metal compound regions 224 in contact with the impurity regions 220, a gate insulating film 208 provided over the channel formation region 216, and the gate electrode 210 provided over the gate insulating film 208.

As the substrate 200 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film including a material other than silicon is provided over an insulating surface. In other words, a semiconductor film included in the "SOI substrate" is not limited to a silicon semiconductor film. Moreover, the SOI substrate can be a substrate having a structure in which a semiconductor film is provided over an insulating substrate such as a glass substrate with an insulating film provided therebetween.

An element isolation insulating film 206 is provided over the substrate 200 so as to surround the transistor 240, and an insulating film 228 and an insulating film 230 are provided to cover the transistor 240. Note that for high integration, it is preferable that, as in FIG. 7A, the transistor 240 does not have a sidewall insulating film. On the other hand, in the case where the characteristics of the transistor 240 have priority, sidewall insulating films may be provided on side surfaces of the gate electrode 210, and the impurity regions 220 may each include a region with a different impurity concentration.

The transistor 240 can be manufactured using silicon, germanium, silicon germanium, silicon carbide, gallium arsenide, or the like. Such a transistor 240 is capable of high speed operation. Thus, when the transistor is used as a reading transistor, data can be read out at high speed.

After the transistor 240 is formed, as treatment prior to the formation of the transistor 120 and a capacitor 164, the insulating film 228 and the insulating film 230 are subjected to CMP treatment so that a top surface of the gate electrode 210 is exposed. As treatment for exposing the top surface of the gate electrode 210, etching treatment or the like can also be employed instead of CMP treatment; in order to improve characteristics of the transistor 120, surfaces of the insulating film 228 and the insulating film 230 are preferably made as flat as possible.

Next, a conductive film is formed over the gate electrode 210, the insulating film 228, the insulating film 230, and the like and the conductive film is selectively etched, so that a source electrode 104a and a drain electrode 104b are formed.

The conductive film can be formed by a PVD method such as a sputtering method or a CVD method such as a plasma CVD method. As the material of the conductive film, an element selected from Al, Cr, Cu, Ta, Ti, Mo, and W, an alloy including any of the above elements as its component, or the like can be used. Any of Mn, Mg, Zr, Be, Nd, and Sc, or a material including any of these in combination may be used.

The conductive film may have either a single-layer structure or a layered structure of two or more layers. For example, the conductive film can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive film has a single-layer structure of a titanium film or a titanium nitride film, there is an advantage that the source electrode 104a and the drain electrode 104b can be easily processed to be tapered.

A channel length (L) of the transistor 120 in the upper portion is determined by a distance between a lower end portion of the source electrode 104a and a lower end portion of the drain electrode 104b. Note that for light exposure for forming a mask used in the case where a transistor with a channel length (L) of less than 25 nm is formed, it is preferable to use extreme ultraviolet rays whose wavelength is as short as several nanometers to several tens of nanometers.

Next, an oxide semiconductor film is formed to cover the source electrode 104a and the drain electrode 104b, and the oxide semiconductor film is selectively etched, so that the oxide semiconductor film 108 is formed. The oxide semiconductor film is formed using the material and the formation process described in Embodiment 1.

Then, a gate insulating film 110 in contact with the oxide semiconductor film 108 is formed. The gate insulating film 110 is formed using the material and the formation process described in Embodiment 1.

Next, over the gate insulating film 110, a gate electrode 112a is formed in a region overlapping with the oxide semiconductor film 108 and an electrode 112b is formed in a region overlapping with the source electrode 104a.

After the gate insulating film 110 is formed, heat treatment (also referred to as supply of oxygen) is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. By performing the heat treatment, variation in electrical characteristics of the transistor can be reduced.

Note that the timing of the heat treatment for supplying oxygen is not limited thereto. For example, the heat treatment for supplying oxygen may be performed after the gate electrode is formed. Alternatively, heat treatment for supply of oxygen may be performed following heat treatment for dehydration or the like; heat treatment for dehydration or the like may also serve as heat treatment for supplying oxygen; or heat treatment for supplying oxygen may also serve as heat treatment for dehydration or the like.

As described above, when heat treatment for dehydration or the like, and oxygen doping or heat treatment for supplying oxygen are performed, the oxide semiconductor film 108 can be highly purified so as to contain impurities as little as possible.

The gate electrode 112a and the electrode 112b can be formed in such a manner that a conductive film is formed over the gate insulating film 110 and then etched selectively.

Next, an insulating film 151 and an insulating film 152 are formed over the gate insulating film 110, the gate electrode 112a, and the electrode 112b. The insulating film 151 and the insulating film 152 can be formed by a sputtering method, a CVD method, or the like. The insulating film 151 and the insulating film 152 can be formed using a material including an inorganic insulating material such as silicon oxide, silicon oxynitride, silicon nitride, hafnium oxide, aluminum oxide, or gallium oxide.

Next, an opening reaching the drain electrode 104b is formed through the gate insulating film 110, the insulating film 151, and the insulating film 152. The opening is formed by selective etching with the use of a mask or the like.

After that, an electrode 154 is formed in the opening, and a wiring 156 which is in contact with the electrode 154 is formed over the insulating film 152.

The electrode 154 can be formed in such a manner, for example, that a conductive film is formed in a region including the opening by a PVD method, a CVD method, or the like and then part of the conductive film is removed by etching, CMP, or the like.

The wiring 156 is formed in such a manner that a conductive film is formed by a PVD method such as a sputtering method or a CVD method such as a plasma CVD method, and then the conductive film is patterned. As a material of the conductive film, an element selected from Al, Cr, Cu, Ta, Ti, Mo, and W, an alloy including any of the above elements as its component, or the like can be used. Any of Mn, Mg, Zr, Be, Nd, and Sc, or a material including any of these in combination may be used. The details are the same as those of the source electrode 104a, the drain electrode 104b, or the like.

Through the above process, the transistor 120 and the capacitor 164 including the highly purified oxide semiconductor film 108 are completed. The capacitor 164 includes the source electrode 104a, the oxide semiconductor film 108, the gate insulating film 110, and the electrode 112b.

Note that in the capacitor 164 in FIGS. 7A to 7C, insulation between the source electrode 104a and the electrode 112b can be sufficiently secured by stacking the oxide semiconductor film 108 and the gate insulating film 110. Needless to say, the capacitor 164 without the oxide semiconductor film 108 may be employed in order to secure sufficient capacitance. Further alternatively, the capacitor 164 may be omitted in the case where a capacitor is not needed.

FIG. 7C illustrates an example of a diagram of a circuit using the semiconductor device as a memory element. In FIG. 7C, one of a source electrode and a drain electrode of the transistor 120, one electrode of the capacitor 164, and a gate electrode of the transistor 240 are electrically connected to each other. A first wiring (1st Line, also referred to as a source line) is electrically connected to a source electrode of the transistor 240. A second wiring (2nd Line, also referred to as a bit line) is electrically connected to a drain electrode of the transistor 240. A third wiring (3rd Line, also referred to as a first signal line) is electrically connected to the other of the source electrode and the drain electrode of the transistor 120. A fourth wiring (4th Line, also referred to as a second signal line) is electrically connected to a gate electrode of the transistor 120. A fifth wiring (5th Line, also referred to as a word line) is electrically connected to the other electrode of the capacitor 164.

The transistor 120 including an oxide semiconductor has extremely low off current; therefore, when the transistor 120 is turned off, the potential of a node (hereinafter, a node FG) where one of the source electrode and drain electrode of the transistor 120, one electrode of the capacitor 164, and the gate electrode of the transistor 240 are electrically connected to each other can be held for an extremely long time. The capacitor 164 facilitates holding of charge given to the node FG and reading of the held data.

When data is stored in the semiconductor device (writing), the potential of the fourth wiring is set to a potential at which the transistor 120 is turned on, whereby the transistor 120 is turned on. Thus, the potential of the third wiring is applied to the node FG and a predetermined amount of charge is accumulated in the node FG. Here, charge for applying either of two different potential levels (hereinafter referred to as a low-level charge and a high-level charge) is given to the node FG. After that, the potential of the fourth wiring is set to a potential at which the transistor 120 is turned off, whereby the transistor 120 is turned off. This makes the node FG floating and the predetermined amount of charge is held in the node FG. The predetermined amount of charge is thus accumulated and held in the node FG whereby the memory cell can store data.

Since the off current of the transistor 120 is extremely small, the charge applied to the node FG is held for a long time. This feature can remove the need of refresh operation or drastically reduce the frequency of the refresh operation, which leads to a sufficient reduction in power consumption. Moreover, stored data can be held for a long time even when power is not supplied.

When stored data is read out (reading), while a predetermined potential (a fixed potential) is applied to the first wiring, an appropriate potential (a read-out potential) is applied to the fifth wiring, whereby the transistor 240 changes its state depending on the amount of charge held in the node FG. This is because, in general, when the transistor 240 is an n-channel transistor, an apparent threshold value $V_{th\_H}$ of the transistor 240 in the case where a high-level charge is held in the node FG is lower than an apparent threshold value $V_{th\_L}$ of the transistor 240 in the case where a low-level charge is held in the node FG. Here, an apparent threshold voltage refers to the potential of the fifth wiring, which is needed to turn on the transistor 240. Thus, by setting the potential of the fifth wiring to a potential $V_0$ which is between $V_{th\_H}$ and $V_{th\_L}$, charge held in the node FG can be determined. For example, in the case where a high-level charge is given in writing, when the potential of the fifth wiring is set to $V_0$ ($>V_{th\_H}$), the transistor 240 is turned on. In the case where a low-level charge is given in writing, even when the potential of the fifth wiring is set to $V_0$ ($<V_{th\_L}$), the transistor 240 remains in an off state. In such a manner, by controlling the potential of the fifth wiring and determining whether the transistor 240 is in an on state or off state (reading out the potential of the second wiring), stored data can be read out.

In order to rewrite stored data, a new potential is applied to the node FG that is holding the predetermined amount of charge given in the above writing, so that the charge of the new data is held in the node FG. Specifically, the potential of the fourth wiring is set to a potential at which the transistor 120 is turned on, whereby the transistor 120 is turned on. Consequently, the potential of the third wiring (a potential of new data) is applied to the node FG, and the predetermined amount of charge is accumulated in the node FG. After that, the potential of the fourth wiring is set to a potential at which the transistor 120 is turned off, whereby the transistor 120 is turned off. Thus, charge of the new data is held in the node FG. In other words, while the predetermined amount of charge given in the first writing is held in the node FG the same operation (a second writing) as that in the first writing is performed, whereby the stored data can be overwritten.

The off current of the transistor 120 described in this embodiment can be sufficiently reduced by using the highly-purified, and intrinsic semiconductor oxide film 108. In addition, the oxide semiconductor film 108 contains excessive oxygen, whereby variation in the electrical characteristics of the transistor 120 is suppressed, so that the transistor which is electrically stable can be obtained. Further, with the use of such a transistor, a highly reliable semiconductor device capable of holding stored data for an extremely long time can be obtained.

In the semiconductor device described in this embodiment, the transistor 240 and the transistor 120 overlap with each other; therefore, a semiconductor device whose integration degree is sufficiently improved can be realized.

The structures, the methods, and the like described in this embodiment can be combined as appropriate with any of the structures, the methods, and the like described in the other embodiments.

Embodiment 6

A semiconductor device having a display function (also referred to as a display device) can be manufactured using the transistor exemplified in any of Embodiments 1 to 3. Moreover, part or all of the driver circuitry which includes the transistor can be formed over a substrate where a pixel portion is formed, whereby a system-on-panel can be obtained.

Figure 8A:
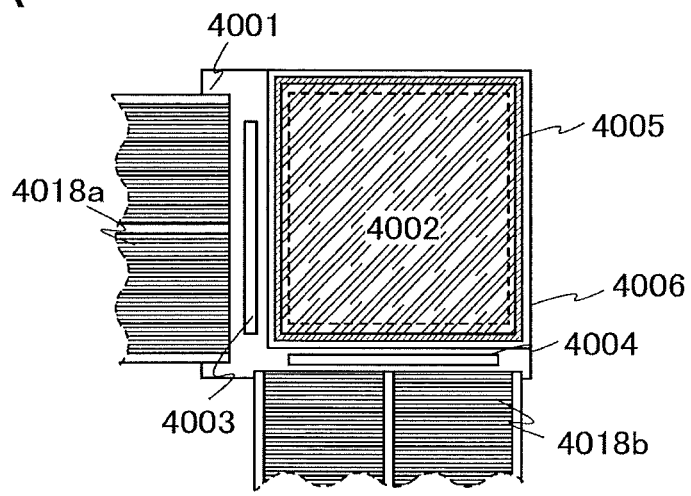
FIGS. 8A to 8C each illustrate an embodiment of a semiconductor device.

In FIG. 8A, a sealant 4005 is provided so as to surround a pixel portion 4002 provided over a first substrate 4001, and the pixel portion 4002 is sealed by using a second substrate 4006. In FIG. 8A, a signal line driver circuit 4003 and a scan line driver circuit 4004 which are separately prepared on a substrate using a single crystal semiconductor film or a polycrystalline semiconductor film are mounted in a region that is different from the region surrounded by the sealant 4005 over the first substrate 4001. Various signals and potentials are supplied to the signal line driver circuit 4003 and the scan line driver circuit 4004 which are separately formed and to the pixel portion 4002 from flexible printed circuits (FPCs) 4018a and 4018b.

Figure 8B:
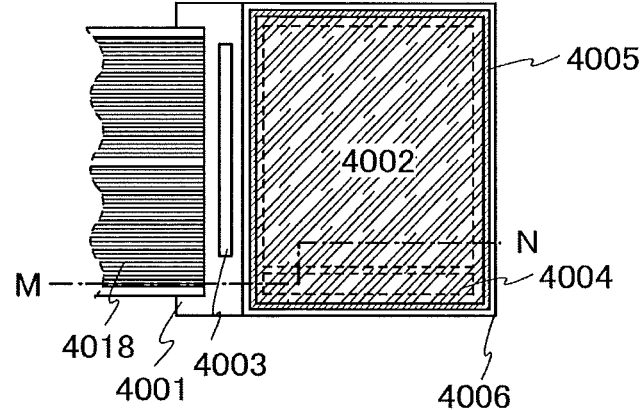
Figure 8C:
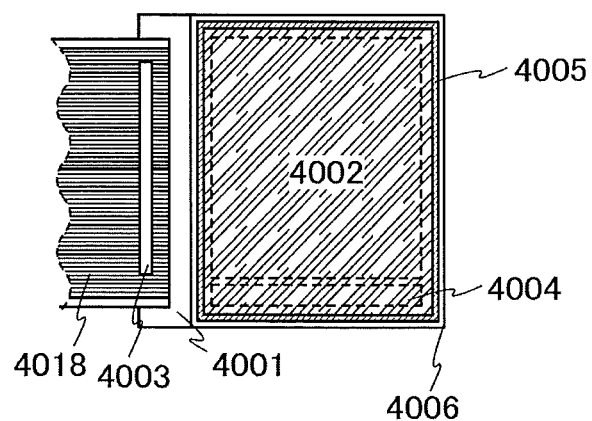

In FIGS. 8B and 8C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 8B and 8C, the signal line driver circuit 4003 which is formed using a single crystal semiconductor film or a polycrystalline semiconductor film over a substrate prepared separately is mounted in a region that is different from the region surrounded by the sealant 4005 over the first substrate 4001. In FIGS. 8B and 8C, various signals and potential are supplied to the signal line driver circuit 4003 which is separately formed, the scan line driver circuit 4004, and the pixel portion 4002 from an FPC 4018.

An embodiment of the present invention is not limited to the structures described in FIGS. 8A to 8C. Only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 8A illustrates an example in which the signal line driver circuit 4003 and the scan line driver circuit 4004 are mounted by a COG method. FIG. 8B illustrates an example in which the signal line driver circuit 4003 is mounted by a COG method. FIG. 8C illustrates an example in which the signal line driver circuit 4003 is mounted by a TAB method.

Note that the display device includes a panel in which the display element is sealed, and a module in which an IC or the like including a controller is mounted on the panel.

Note that the display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and any of the transistors which are described in Embodiments 1 to 3 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 9:
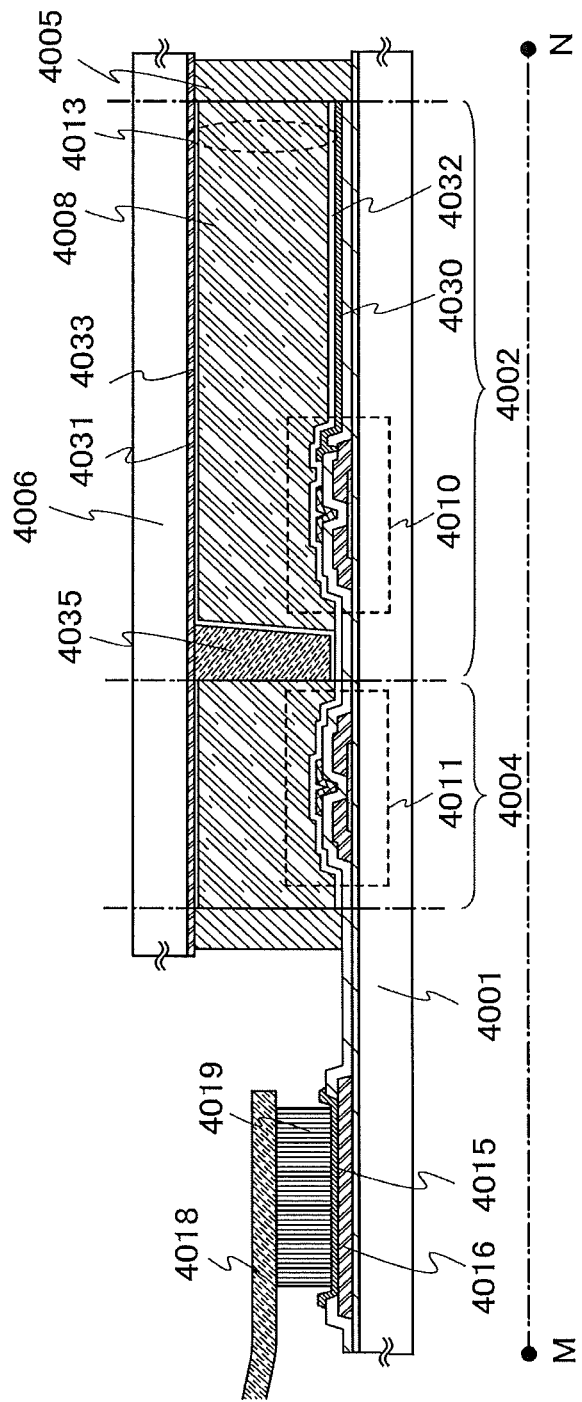
FIG. 9 illustrates an embodiment of a semiconductor device.
Figure 10:
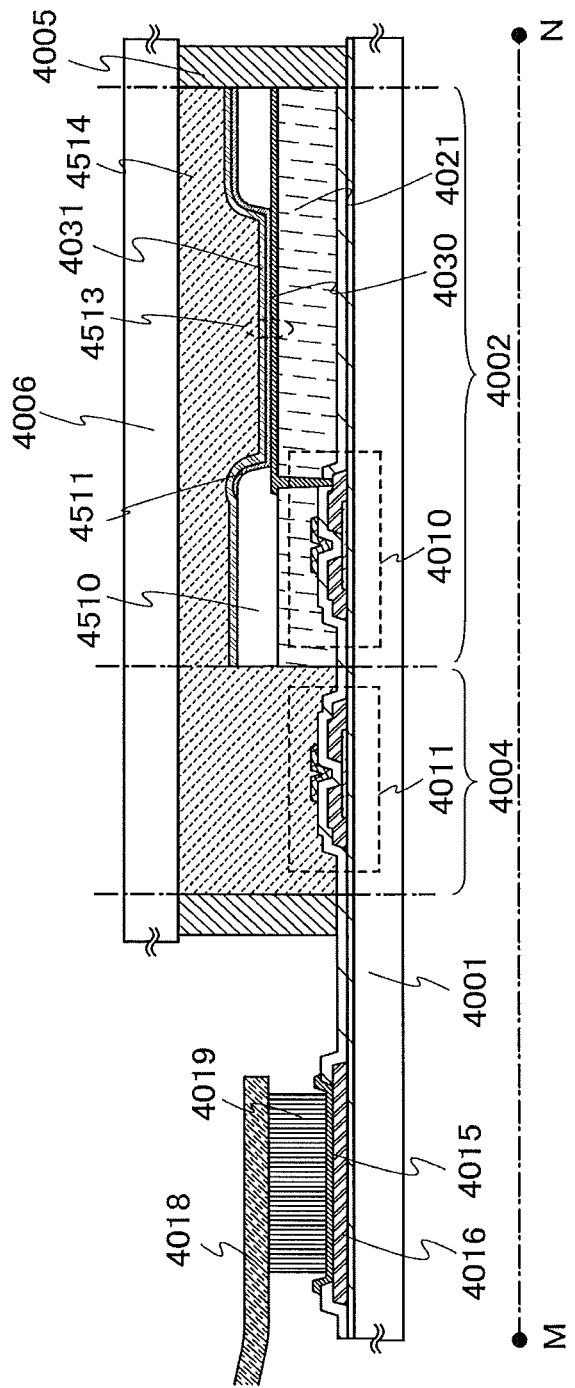
FIG. 10 illustrates an embodiment of a semiconductor device.
Figure 11:
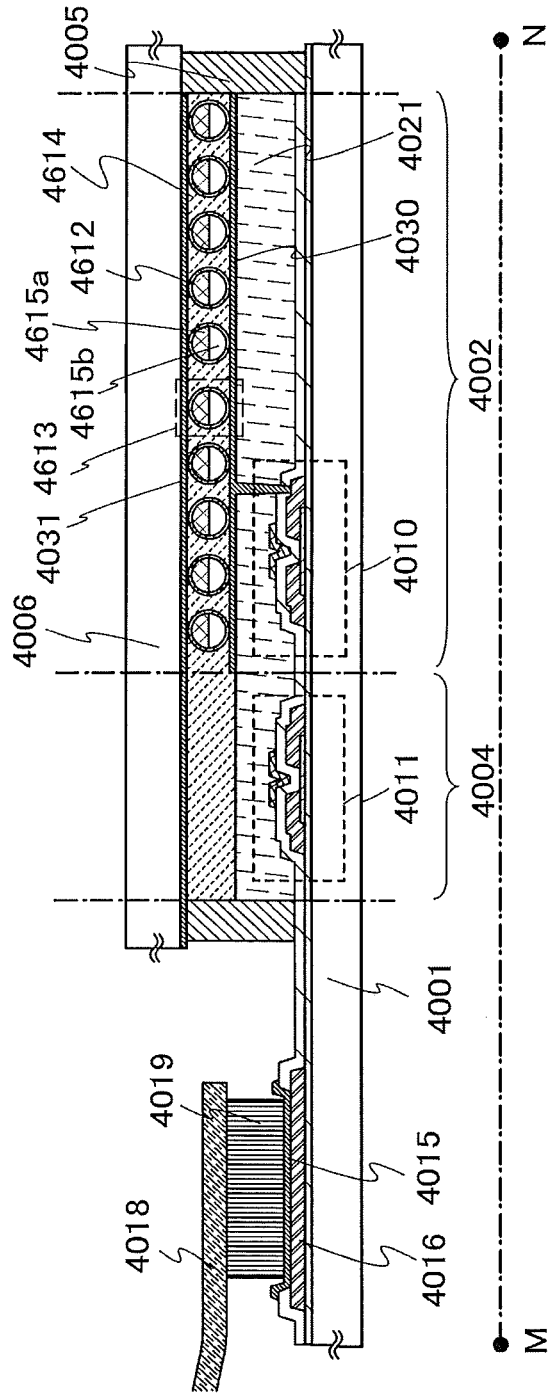
FIG. 11 illustrates an embodiment of a semiconductor device.

An embodiment of the semiconductor device is described with reference to FIG. 9, FIG. 10, and FIG. 11. FIG. 9, FIG. 10, and FIG. 11 correspond to cross-sectional views taken along line M-N in FIG. 8B.

As illustrated in FIG. 9 to FIG. 11, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrodes of transistors 4010 and 4011.

The pixel portion 4002 and the scan line driver circuit 4004 which are provided over the first substrate 4001 include a plurality of transistors. In FIG. 9 to FIG. 11, the transistor 4010 included in the pixel portion 4002 and the transistor 4011 included in the scan line driver circuit 4004 are illustrated as an example. In FIG. 10 and FIG. 11, an insulating layer 4021 is provided over the transistors 4010 and 4011.

In this embodiment, the transistor described in any of Embodiments 1 to 3 can be applied to the transistor 4010 and the transistor 4011. Variation in electrical characteristics of the transistor 4010 and the transistor 4011 is suppressed and the transistor 4010 and the transistor 4011 are electrically stable. Therefore, highly reliable semiconductor devices can be provided as the semiconductor devices illustrated in FIG. 9 to FIG. 11.

The transistor 4010 provided in the pixel portion 4002 is electrically connected to a display element in a display panel. A variety of display elements can be used as the display element as long as display can be performed.

Note that an example of a liquid crystal display device using a liquid crystal element as a display element is described in FIG. 9. In FIG. 9, a liquid crystal element 4013 which is a display element includes the first electrode layer 4030, the second electrode layer 4031, and a liquid crystal layer 4008. An insulating film 4032 and an insulating film 4033 which serve as alignment films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween. Note that in the display device illustrated in FIG. 8B, a cross section taken along line M-N in the case where a liquid crystal element is used as the display element corresponds to FIG. 9.

Reference numeral 4035 is a columnar spacer obtained by selective etching of an insulating film and is provided in order to control the thickness (a cell gap) of the liquid crystal layer 4008. Note that the spacer is not limited to a columnar spacer, and, for example, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which appears just before a cholesteric phase changes into an isotropic phase while temperature of cholesteric liquid crystal is increased.

Since the blue phase appears only in a narrow temperature range, a liquid crystal composition in which five weight percent or more of a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment film need not be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1\times10^9$ Ω·cm or more, preferably $1\times10^{11}$ Ω·cm or more, more preferably $1\times10^{12}$ Ω·cm or more. The value of the specific resistivity in this specification is measured at 20° C.

The size of a storage capacitor formed in the liquid crystal display device is set considering the leakage current of the transistor provided in the pixel portion or the like so that charge can be held during a predetermined period. By using the transistor including the highly purified oxide semiconductor film, it is enough to provide a storage capacitor having a capacitance that is 1/3 or less, preferably 1/5 or less of a liquid crystal capacitance of each pixel.

In the transistor used in this embodiment, which includes the highly purified oxide semiconductor film, the current in an off state (the off current) can be made small. Accordingly, an electrical signal such as an image signal can be held for a long period, and a writing interval can be set long in a state where power is being supplied. Accordingly, the frequency of refresh operation can be reduced, which leads to an effect of suppressing power consumption.

In addition, the transistor including the highly purified oxide semiconductor film used in this embodiment can have relatively high field-effect mobility and thus is capable of high speed operation. Therefore, by using the transistor in the pixel portion of the liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, or the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors of R, and B (R, and B correspond to red, green, and blue, respectively). For example, the following can be used: R, B, and W (W corresponds to white); or R, G, B, and one or more of yellow, cyan, magenta, and the like. Further, the sizes of display regions may be different between respective dots of the color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of a pair of electrodes is transparent. The transistor and the light-emitting element are provided over the substrate. The light-emitting element can have any of the following structures: a top emission structure in which light emission is extracted through the surface opposite to the substrate; a bottom emission structure in which light emission is extracted through the surface on the substrate side; and a dual emission structure in which light emission is extracted through the surface opposite to the substrate and the surface on the substrate side.

An example of a light-emitting device in which a light-emitting element is used as a display element is illustrated in FIG. 10. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 10. The structure of the light-emitting element 4513 can be changed as appropriate depending on a direction in which light is extracted from the light-emitting element 4513, or the like. Note that in the display device illustrated in FIG. 8B, a cross section taken along line M-N in the case where an organic EL element is used as the display element corresponds to FIG. 10.

A partition wall 4510 is formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, PVC (poly(vinyl chloride)), an acrylic resin, a polyimide, an epoxy resin, a silicone resin, PVB (poly(vinyl butyral)), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate for a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A mixture in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be also used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 11 illustrates active matrix electronic paper as an embodiment of a semiconductor device. The electronic paper in FIG. 11 is an example of a display device using a twisting ball display system.

Between the first electrode layer 4030 connected to the transistor 4010 and the second electrode layer 4031 provided for the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 9 to FIG. 11, a flexible substrate as well as a glass substrate can be used as the first substrate 4001 and the second substrate 4006. For example, a plastic substrate having light-transmitting properties can be used. As plastic, a fiberglass-reinforced plastics (FRP) plate, a poly(vinyl fluoride) (PVF) film, a polyester film, or an acrylic resin film can be used. In addition, a sheet with a structure in which an aluminum foil is sandwiched between PVF films or polyester films can be used.

The insulating layer 4021 can be formed using an inorganic insulating material or an organic insulating material. Note that the insulating layer 4021 formed using a heat-resistant organic insulating material such as an acrylic resin, a polyimide, a benzocyclobutene-based resin, a polyamide, or an epoxy resin is preferably used as a planarizing insulating film. In addition to such organic insulating materials, it is possible to use a low-dielectric constant material (a low-k material), a siloxane based resin, phosphosilicate glass (PSG), borophosphosilicate glass (BPSG), or the like. The insulating layer may be foamed by stacking a plurality of insulating films formed of these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method), screen printing, offset printing, roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

Any of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Any of the first electrode layer 4030 and the second electrode layer 4031 can be formed using one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

Since the transistor is easily broken owing to static electricity or the like, a protective circuit for protecting the driver circuit is preferably provided. The protective circuit is preferably formed using a non-linear element.

As described above, by using any of the transistors exemplified in Embodiments 1 to 3, a highly reliable semiconductor device can be provided.

This embodiment can be implemented in appropriate combination with any of the structures described in the other embodiments.

Embodiment 7

A semiconductor device having an image sensor function for reading data of an object can be formed with the use of the transistor whose example is described in any of Embodiments 1 to 3.

Figure 12A:
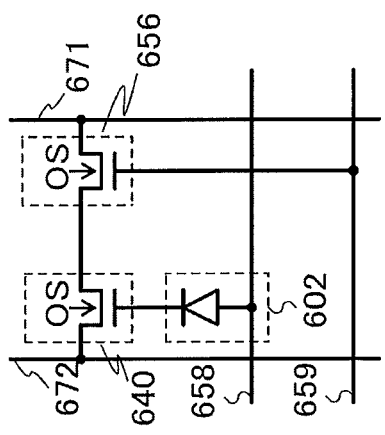
FIGS. 12A and 12B illustrate an embodiment of a semiconductor device.

An example of a semiconductor device having an image sensor function is illustrated in FIG. 12A. FIG. 12A illustrates an equivalent circuit of a photo sensor, and FIG. 12B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor film is denoted by a symbol "OS" so that it can be identified as a transistor including an oxide semiconductor film. The transistor 640 and the transistor 656 in FIG. 12A are transistors each including an oxide semiconductor film.

Figure 12B:
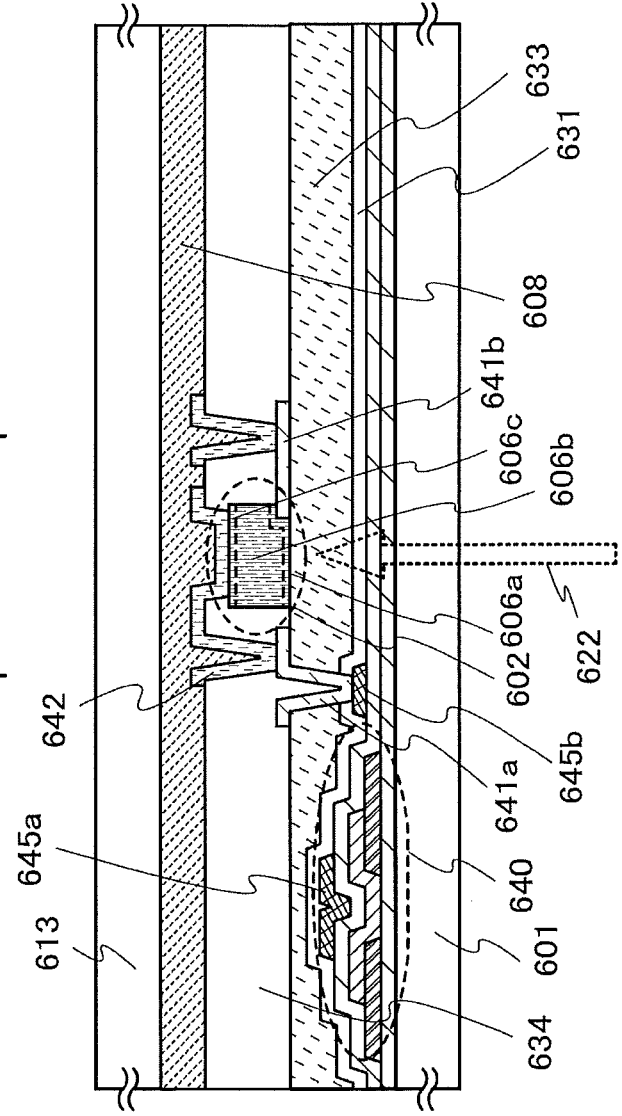

FIG. 12B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 with an adhesive layer 608 provided therebetween. In addition, an insulating film 631, a first interlayer insulating layer 633, and a second interlayer insulating layer 634 are provided over the transistor 640.

Further, an electrode layer 645b is provided in the same layer as the gate electrode 645a of the transistor 640 so as to be electrically connected to the gate electrode 645a of the transistor 640. The electrode layer 645b is electrically connected to an electrode layer 641a through an opening provided in the insulating film 631 and the first interlayer insulating layer 633. The electrode layer 641a is electrically connected to an electrode layer 642 formed in the second interlayer insulating layer 634, and the electrode layer 642 is electrically connected to the gate electrode 645a through the electrode layer 641a; accordingly, the photodiode 602 is electrically connected to the transistor 640.

The photodiode 602 is provided over the first interlayer insulating layer 633. In the photodiode 602, a first semiconductor layer 606a, a second semiconductor layer 606b, and a third semiconductor layer 606c are sequentially stacked from the first interlayer insulating layer 633 side, between an electrode layer 641b formed over the first interlayer insulating layer 633 and the electrode layer 642 formed over the second interlayer insulating layer 634.

In this embodiment, any of the transistors described in Embodiments 1, 2, or 3 can be applied to the transistor 640. Variation in the electrical characteristics of the transistor 640 and the transistor 656 is suppressed and the transistor 640 and the transistor 656 are electrically stable. Therefore, a highly reliable semiconductor device can be provided as the semiconductor device of this embodiment described in FIGS. 12A and 12B.

Here, a pin photodiode in which a semiconductor layer having a p-type conductivity as the first semiconductor layer 606a, a high-resistance semiconductor layer (i-type semiconductor layer) as the second semiconductor layer 606b, and a semiconductor layer having an n-type conductivity as the third semiconductor layer 606c are stacked is illustrated as an example.

The first semiconductor layer 606a is a p-type semiconductor layer and can be formed using an amorphous silicon film containing an impurity element imparting a p-type conductivity. The first semiconductor layer 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion implantation method or the like in order to diffuse the impurity element. In that case, as a method of forming the amorphous silicon film, an LPCVD method, a chemical vapor deposition method, a sputtering method, or the like may be used. The first semiconductor layer 606a is preferably formed to have a thickness greater than or equal to 10 nm and less than or equal to 50 nm.

The second semiconductor layer 606b is an i-type semiconductor layer (intrinsic semiconductor layer) and is formed using an amorphous silicon film. As for formation of the second semiconductor layer 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be formed by an LPCVD method, a vapor deposition method, a sputtering method, or the like. The second semiconductor layer 606b is preferably formed to have a thickness greater than or equal to 200 nm and less than or equal to 1000 nm.

The third semiconductor layer 606c is an n-type semiconductor layer and is formed using an amorphous silicon film containing an impurity element imparting an n-type conductivity. The third semiconductor layer 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion injecting method or the like in order to diffuse the impurity element. In that case, as a method of forming the amorphous silicon film, an LPCVD method, a chemical vapor deposition method, a sputtering method, or the like may be used. The third semiconductor layer 606c is preferably formed to have a thickness greater than or equal to 20 nm and less than or equal to 200 nm.

Any of the first semiconductor layer 606a, the second semiconductor layer 606b, and the third semiconductor layer 606c is not necessarily formed using an amorphous semiconductor, and may be formed using a polycrystalline semiconductor, or a microcrystalline semiconductor (a semi-amorphous semiconductor: SAS).

The microcrystalline semiconductor belongs to a metastable state of an intermediate between amorphous and single crystalline when Gibbs free energy is considered. That is, the microcrystalline semiconductor is a semiconductor having a third state which thermodynamically stable and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wavenumber than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. The semiconductor contains hydrogen or halogen of at least 1 at. % to terminate a dangling bond. Moreover, microcrystalline silicon is made to contain a rare gas element such as helium, argon, krypton, or neon to further enhance lattice distortion, whereby stability is increased and a favorable microcrystalline semiconductor film can be obtained.

The microcrystalline semiconductor film can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed by using a gas obtained by diluting $SiH_4$, $Si_2H_6$, $SiH_2Cl_2$, $SiHCl_3$, $SiCl_4$, or $SiF_4$ with hydrogen. Further, with a dilution of silicon hydride and hydrogen with one or plural kinds of rare gas elements selected from helium, argon, krypton, and neon, the microcrystalline semiconductor film can be formed. In that case, the flow ratio of hydrogen to silicon hydride is 5:1 to 200:1, preferably 50:1 to 150:1, more preferably 100:1. Further, a hydrocarbon gas such as $CH_4$ or $C_2H_6$, a germanium gas such as $GeH_4$ or $GeF_4$, $F_2$, or the like may be mixed into the gas containing silicon.

In addition, since the mobility of holes generated by a photoelectric effect is lower than that of electrons, a pin photodiode exhibits better characteristics when a surface on the p-type semiconductor layer side is used as a light-receiving plane. Here, an example in which light 622 received by the photodiode 602 from a surface of the substrate 601, over which the pin photodiode is formed, is converted into electric signals will be described. Further, light from the semiconductor layer having a conductivity type opposite from that of the semiconductor layer on the light-receiving plane is disturbance light; therefore, the electrode layer 642 on the semiconductor layer having the opposite conductivity type is preferably formed from a light-blocking conductive film. Note that a surface of the n-type semiconductor layer side can alternatively be used as the light-receiving plane.

For reduction of the surface roughness, an insulating layer functioning as a planarizing insulating film is preferably used for the first interlayer insulating layer 633 and the second interlayer insulating layer 634. Any of the first interlayer insulating layer 633 and the second interlayer insulating layer 634 can be formed using, for example, an organic insulating material such as a polyimide, an acrylic resin, a benzocyclobutene-based resin, a polyamide, or an epoxy resin. In addition to such organic insulating materials, it is possible to use a single layer or stacked layers of a low-dielectric constant material (a low-k material), a siloxane-based resin, phosphosilicate glass (PSG), borophosphosilicate glass (BPSG), or the like.

Any of the insulating film 631, the first interlayer insulating layer 633, and the second interlayer insulating layer 634 can be formed using an insulating material by a sputtering method, a spin coating method, a dipping method, spray coating, a droplet discharge method (e.g., an inkjet method), screen printing, offset printing, roll coating, curtain coating, knife coating, or the like depending on the material.

When the light 622 that enters the photodiode 602 is detected, data on an object to be detected can be read. Note that a light source such as a backlight can be used at the time of reading data on an object.

The transistor whose example is described in Embodiment 1, 2, or 3 can be used as the transistor 640. The transistor including the oxide semiconductor film which is highly purified by intentionally removing impurities such as hydrogen, moisture, a hydroxyl group, or a hydride (also referred to as a hydrogen compound) and contains excessive oxygen supplied by oxygen doping treatment or the like has a suppressed variation in the electrical characteristics and is electrically stable. Therefore, a highly reliable semiconductor device can be provided.

The structures, the methods, and the like described in this embodiment can be combined as appropriate with any of the structures, the methods, and the like described in the other embodiments.

Embodiment 8

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances each including the liquid crystal display device described in the above embodiment will be described.

Figure 13A:
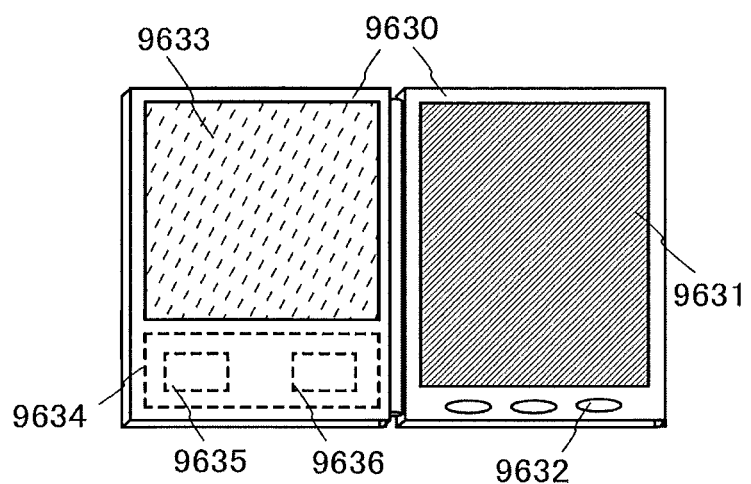
FIGS. 13A and 13B illustrate an electronic appliance.

FIG. 13A illustrates an electronic book reader (also referred to as an e-book reader) which can include housings 9630, a display portion 9631, operation keys 9632, a solar cell 9633, and a charge and discharge control circuit 9634. The electronic book reader illustrated in FIG. 13A has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Note that in FIG. 13A, the charge and discharge control circuit 9634 has a battery 9635 and a DCDC converter (hereinafter, abbreviated as a converter) 9636. The semiconductor device described in any of the above embodiments can be applied to the display portion 9631, whereby a highly-reliable electronic book reader can be provided.

In the case where a semi-transmissive liquid crystal display device or a reflective liquid crystal display device is used as the display portion 9631, use under a relatively bright condition is assumed; therefore, the structure illustrated in FIG. 13A is preferable because power generation by the solar cell 9633 and charge for the battery 9635 are effectively performed. Since the solar cell 9633 can be provided in a space (a surface or a rear surface) of the housing 9630 as appropriate, the battery 9635 can be efficiently charged, which is preferable. When a lithium ion battery is used as the battery 9635, there is an advantage of downsizing or the like.

Figure 13B:
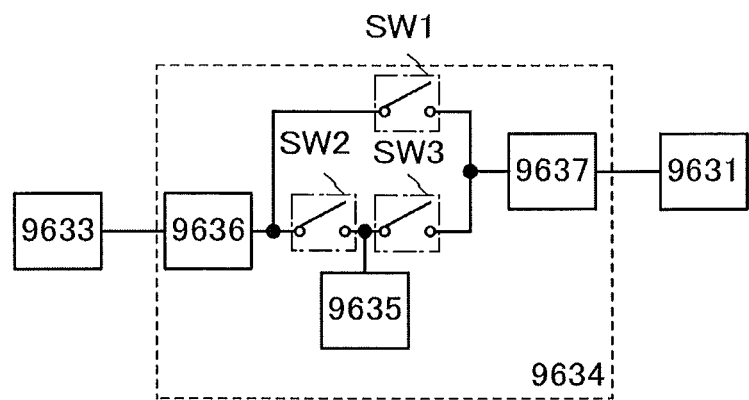

The structure and the operation of the charge and discharge control circuit 9634 illustrated in FIG. 13A will be described with reference to a block diagram in FIG. 13B. The solar cell 9633, the battery 9635, the converter 9636, a converter 9637, switches SW1 to SW3, and the display portion 9631 are shown in FIG. 13B, and the battery 9635, the converter 9636, the converter 9637, and the switches SW1 to SW3 correspond to the charge and discharge control circuit 9634.

First, an example of operation in the case where power is generated by the solar cell 9633 using external light is described. The voltage of power generated by the solar cell is raised or lowered by the converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 to a voltage needed for the display portion 9631. In addition, when display on the display portion 9631 is not performed, the switch SW1 is turned off and the switch SW2 is turned on so that charge of the battery 9635 may be performed.

Next, operation in the case where power is not generated by the solar cell 9633 using external light is described. The voltage of power accumulated in the battery 9635 is raised or lowered by the converter 9637 by turning on the switch SW3. Then, power from the battery 9635 is used for the operation of the display portion 9631.

Note that although the solar cell 9633 is described as an example of a means for charge, the battery 9635 may be charged with another means. In addition, a combination of the solar cell 9633 and another means for charge may be used.

Figure 14A:
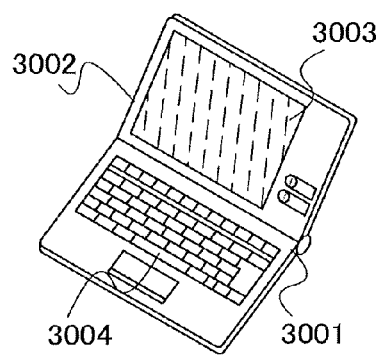
FIGS. 14A to 14F illustrate electronic appliances.

FIG. 14A illustrates a laptop personal computer, which includes a main body 3001, a housing 3002, a display portion 3003, a keyboard 3004, and the like. By applying the semiconductor device described in any of the above embodiments to the display portion 3003, a highly-reliable laptop personal computer can be obtained.

Figure 14B:
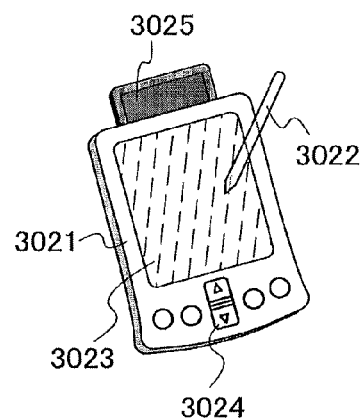

FIG. 14B is a personal digital assistant (PDA), which includes a main body 3021 provided with a display portion 3023, an external interface 3025, operation buttons 3024, and the like. A stylus 3022 is included as an accessory for operation. By applying the semiconductor device described in any of the above embodiments to the display portion 3023, a highly-reliable personal digital assistant (PDA) can be obtained.

Figure 14C:
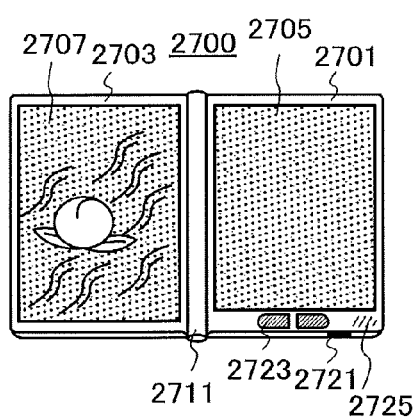

FIG. 14C illustrates an example of an electronic book reader. For example, an electronic book reader 2700 includes two housings, i.e., a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 14C) displays text and the left display portion (the display portion 2707 in FIG. 14C) displays images. By applying the semiconductor device described in any of the above embodiments to the display portions 2705 and 2707, the electronic book reader 2700 can have high reliability.

FIG. 14C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a structure capable of wirelessly transmitting and receiving data. Through wireless communication, desired book data or the like can be purchased and downloaded from an electronic book server.

Figure 14D:
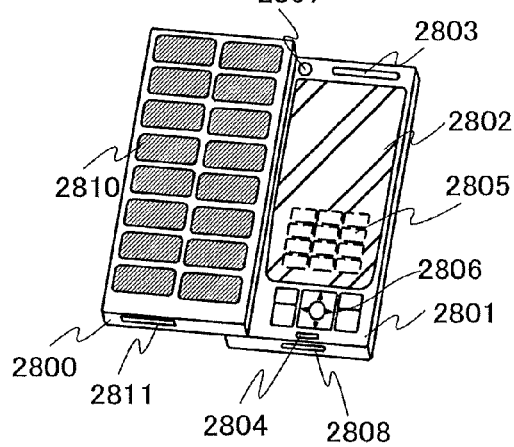

FIG. 14D illustrates a mobile phone, which includes two housings, i.e., a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. An antenna is incorporated in the housing 2801. By applying the semiconductor device described in any of the above embodiments to the display panel 2802, a highly-reliable mobile phone can be obtained.

Further, the display panel 2802 is provided with a touch panel. A plurality of operation keys 2805 which is displayed as images is illustrated by dashed lines in FIG. 14D. Note that a boosting circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Furthermore, the housings 2800 and 2801 which are developed as illustrated in FIG. 14D can overlap with each other by sliding; thus, the size of the mobile phone can be decreased, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 14E:
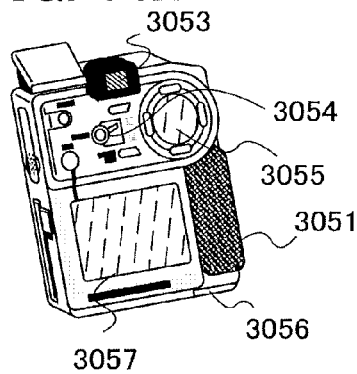

FIG. 14E illustrates a digital video camera which includes a main body 3051, a display portion A 3057, an eyepiece portion 3053, an operation switch 3054, a display portion B 3055, a battery 3056, and the like. By applying the semiconductor device described in any of the above embodiments to the display portion A 3057 and the display portion B 3055, a highly-reliable digital video camera can be obtained.

Figure 14F:
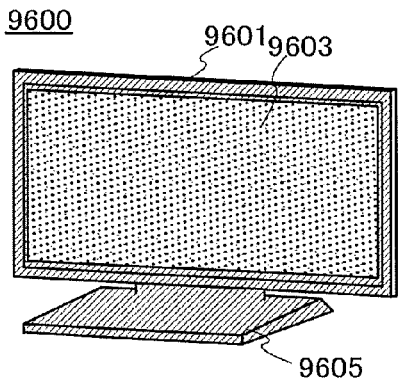
Figure 15:
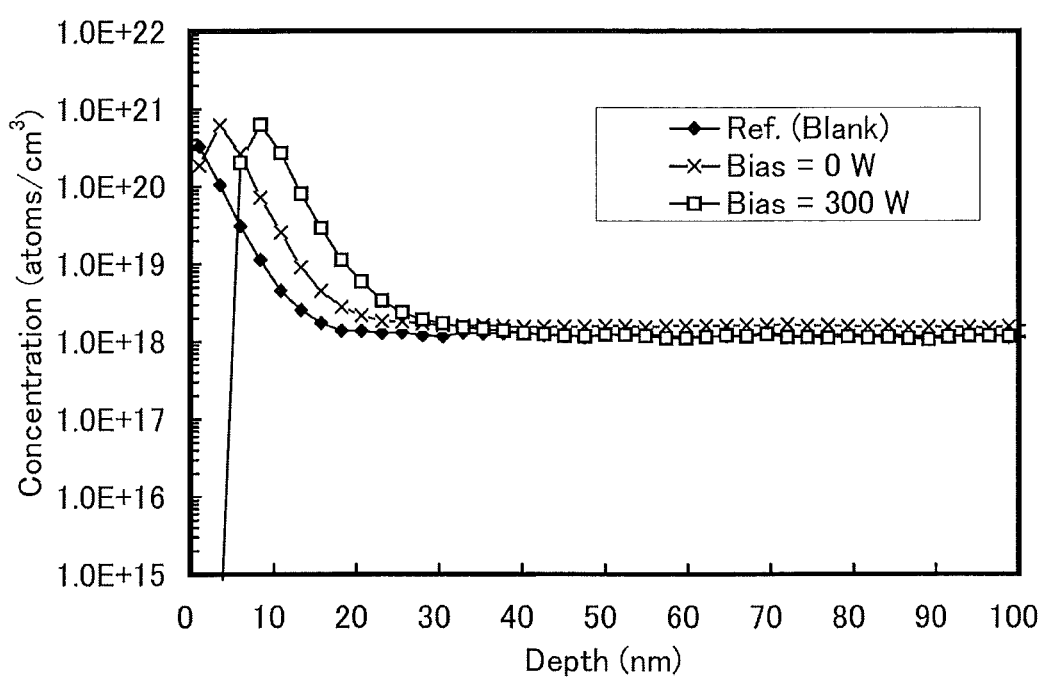
FIG. 15 shows SIMS measurement results of an oxygen-doped silicon wafer.
Figure 16A:
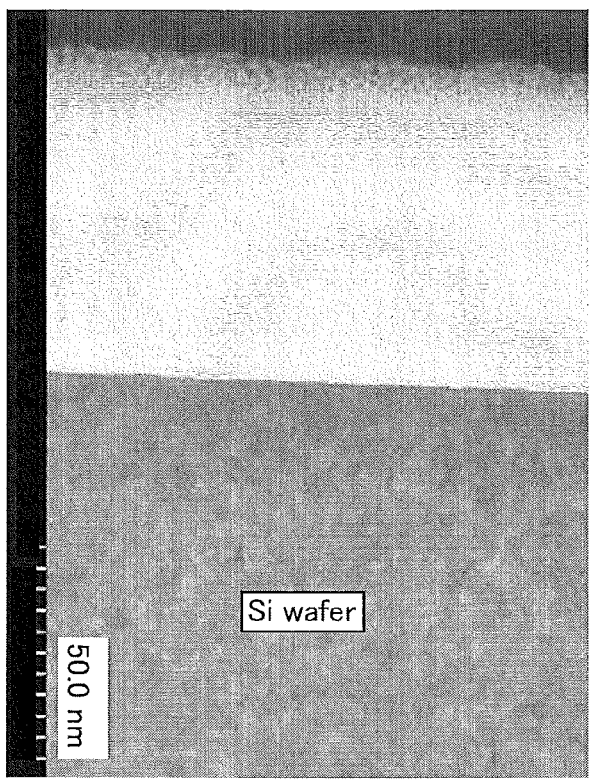
FIGS. 16A and 16B are cross-sectional STEM images.
Figure 16B:
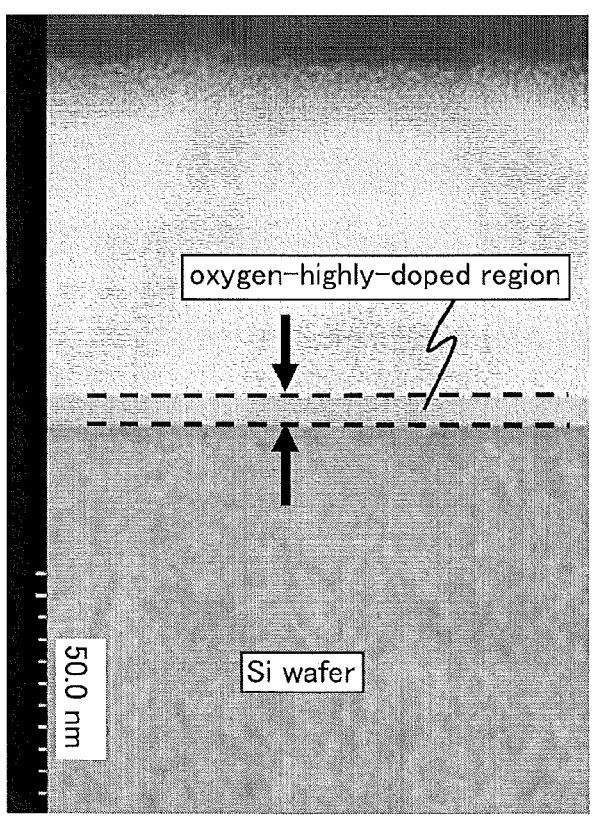

FIG. 14F illustrates an example of a television device. In a television set 9600, a display portion 9603 is incorporated in a housing 9601. The display portion 9603 can display images. Here, the housing 9601 is supported by a stand 9605. By applying the semiconductor device described in any of the above embodiments to the display portion 9603, the television set 9600 with high reliability can be obtained.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures, methods, and the like described in this embodiment can be combined as appropriate with any of the structures, methods, and the like described in the other embodiments.

This application is based on Japanese Patent Application serial no. 2010-100241 filed with Japan Patent Office on Apr. 23, 2010, the entire contents of which are hereby incorporated by reference.

EXPLANATION OF REFERENCE

10: plasma apparatus; 11: substrate supply chamber; 12: load lock chamber; 13: transfer chamber; 14: cassette port; 15: vacuum chamber; 16: ICP coil; 17: gas flow path; 18: high-frequency power source; 19: substrate stage; 20: process substrate; 21: high-frequency power source; 22: automatic pressure control valve; 23: turbo molecular pump; 24: dry pump; 100: substrate; 102: insulating film; 102*a*: insulating film; 102*b*: insulating film; 103*a*: mask; 103*b*: mask; 104*a*: source electrode; 104*b*: drain electrode; 106: oxide semiconductor film; 108: oxide semiconductor film; 110: gate insulating film; 110*a*: gate insulating film; 110*b*: gate insulating film; 112: gate electrode; 112*a*: gate electrode; 112*b*: electrode; 114: insulating film; 120: transistor; 130: transistor; 140: transistor; 150: transistor; 151: insulating film; 152: insulating film; 154: electrode; 156: wiring; 160: transistor; 164: capacitor; 180: oxygen; 180*a*: oxygen; 180*b*: oxygen; 180*c*: oxygen; 200: substrate; 206: element isolation insulating film; 208: gate insulating film; 210: gate electrode; 216: channel formation region; 220: impurity region; 224: metal compound region; 228: insulating film; 230: insulating film; 240: transistor; 601: substrate; 602: photodiode; 606*a*: semiconductor layer; 606*b*: semiconductor layer; 606*c*: semiconductor layer; 608: adhesive layer; 613: substrate; 631: insulating film; 633: interlayer insulating layer; 634: interlayer insulating layer; 640: transistor; 641: electrode layer; 642: electrode layer; 643: conductive layer; 645: gate electrode; 656: transistor; 658: photodiode reset signal line; 659: gate signal line; 671: photo sensor output signal line; 672: photo sensor reference signal line; 2700: electronic book reader; 2701: housing; 2703: housing; 2705: display portion; 2707: display portion; 2711: hinge; 2721: power switch; 2723: operation key; 2725: speaker; 2800: housing; 2801: housing; 2802: display panel; 2803: speaker; 2804: microphone; 2805: operation key; 2806: pointing device; 2807: camera lens; 2808: external connection terminal; 2810: solar cell; 2811: external memory slot; 3001: main body; 3002: housing; 3003: display portion; 3004: keyboard; 3021: main body; 3022: stylus; 3023: display portion; 3024: operation button; 3025: external interface; 3051: main body; 3053: eyepiece portion; 3054: operation switch; 3055: display portion B; 3056: battery; 3057: display portion A; 4001: substrate; 4002: pixel portion; 4003: signal line driver circuit; 4004: scan line driver circuit; 4005: sealant; 4006: substrate; 4008: liquid crystal layer; 4010: transistor; 4011: transistor; 4013: liquid crystal element; 4015: connection terminal electrode; 4016: terminal electrode; 4018*a*: FPC; 4018*b*: FPC; 4019: anisotropic conductive film; 4021: insulating layer; 4030: electrode layer; 4031: electrode layer; 4032: insulating film; 4510: partition wall; 4511: electroluminescent layer; 4513: light-emitting element; 4514: filler; 4612: cavity; 4613: spherical particle; 4614: filler; 4615*a*: black region; 4615*b*: white region; 9600: television set; 9601: housing; 9603: display portion; 9605: stand; 9630: housing; 9631: display portion; 9632: operation key; 9633: solar cell; 9634: charge and discharge control circuit; 9635: battery; 9636: converter; 9637: converter.

The invention claimed is:

1. A method for manufacturing a semiconductor device, the method comprising the steps of:
    forming a first insulating film over a substrate;
    performing oxygen doping treatment on the first insulating film;
    forming a source electrode, a drain electrode, and an oxide semiconductor film over the first insulating film;
    forming a second insulating film over the source electrode, the drain electrode, and the oxide semiconductor film; and
    forming a gate electrode over the second insulating film so that the gate electrode overlaps with the oxide semiconductor film, wherein the first insulating film comprises a fourth insulating film and a fifth insulating film over the fourth insulating film, and
wherein the fifth insulating film comprises a component which is the same as that of the oxide semiconductor film.

2. The method according to claim 1, wherein the oxide semiconductor film is formed over the source electrode and the drain electrode.

3. The method according to claim 1, wherein the source electrode and the drain electrode are formed over the oxide semiconductor film.

4. The method according to claim 1, further comprising a step of forming a third insulating film over the gate electrode.

5. The method according to claim 4,
wherein the third insulating film comprises a sixth insulating film and a seventh insulating film over the sixth insulating film, and
wherein the sixth insulating film comprises a component which is the same as that of the oxide semiconductor film.

6. The method according to claim 4,
wherein the third insulating film comprises a sixth insulating film and a seventh insulating film over the sixth insulating film,
wherein the sixth insulating film comprises a component which is the same as that of the oxide semiconductor film, and
wherein the seventh insulating film comprises a component which is different from that of the oxide semiconductor film.

7. The method according to claim 1,
wherein the fourth insulating film comprises a component which is different from that of the oxide semiconductor film.

8. The method according to claim 1, wherein the oxide semiconductor film comprises gallium as a component.

9. The method according to claim 1, wherein a heating of the substrate is performed at a temperature equal to or higher than 100° C. and equal to or lower than 600° C.

10. The method according to claim 1, further comprising a step of performing heat treatment on the oxide semiconductor film at a temperature equal to or higher than 250° C. and equal to or lower than 650° C.

11. A method for manufacturing a semiconductor device, the method comprising the steps of:
forming a first insulating film over a substrate;
supplying oxygen to the first insulating film;
forming a source electrode, a drain electrode, and an oxide semiconductor film over the first insulating film;
forming a second insulating film over the source electrode, the drain electrode, and the oxide semiconductor film; and
forming a gate electrode over the second insulating film so that the gate electrode overlaps with the oxide semiconductor film,
wherein the first insulating film comprises a fourth insulating film and a fifth insulating film over the fourth insulating film, and
wherein the fifth insulating film comprises a component which is the same as that of the oxide semiconductor film.

12. The method according to claim 11, wherein the oxide semiconductor film is formed over the source electrode and the drain electrode.

13. The method according to claim 11, wherein the source electrode and the drain electrode are formed over the oxide semiconductor film.

14. The method according to claim 11, further comprising a step of forming a third insulating film over the gate electrode.

15. The method according to claim 14,
wherein the third insulating film comprises a sixth insulating film and a seventh insulating film over the sixth insulating film, and
wherein the sixth insulating film comprises a component which is the same as that of the oxide semiconductor film.

16. The method according to claim 14,
wherein the third insulating film comprises a sixth insulating film and a seventh insulating film over the sixth insulating film,
wherein the sixth insulating film comprises a component which is the same as that of the oxide semiconductor film, and
wherein the seventh insulating film comprises a component which is different from that of the oxide semiconductor film.

17. The method according to claim 11,
wherein the fourth insulating film comprises a component which is different from that of the oxide semiconductor film.

18. The method according to claim 11, wherein the oxide semiconductor film comprises gallium as a component.

19. The method according to claim 11, further comprising a step of performing heat treatment on the oxide semiconductor film at a temperature equal to or higher than 250° C. and equal to or lower than 650° C.

20. A method for manufacturing a semiconductor device, the method comprising the steps of:
forming a first insulating film over a substrate;
performing oxygen doping treatment on the first insulating film; and
forming a transistor over the first insulating film, the transistor comprising a source electrode, a drain electrode, an oxide semiconductor film, a gate insulating film, and a gate electrode,
wherein the first insulating film comprises a fourth insulating film and a fifth insulating film over the fourth insulating film, and
wherein the fifth insulating film comprises a component which is the same as that of the oxide semiconductor film.

21. The method according to claim 20, wherein the oxide semiconductor film is formed over the source electrode and the drain electrode.

22. The method according to claim 20, wherein the source electrode and the drain electrode are formed over the oxide semiconductor film.

23. The method according to claim 20, further comprising a step of forming a third insulating film over the transistor.

24. The method according to claim 23,
wherein the third insulating film comprises a sixth insulating film and a seventh insulating film over the sixth insulating film, and
wherein the sixth insulating film comprises a component which is the same as that of the oxide semiconductor film.

25. The method according to claim 23,
wherein the third insulating film comprises a sixth insulating film and a seventh insulating film over the sixth insulating film, wherein the sixth insulating film comprises a component which is the same as that of the oxide semiconductor film, and wherein the seventh insulating film comprises a component which is different from that of the oxide semiconductor film.

26. The method according to claim 20, wherein the fourth insulating film comprises a component which is different from that of the oxide semiconductor film.

27. The method according to claim 20, wherein the oxide semiconductor film comprises gallium as a component.

* * * * *